(12) United States Patent
Saitoh et al.

(10) Patent No.: US 6,369,332 B1
(45) Date of Patent: Apr. 9, 2002

(54) METAL-BASE MULTILAYER CIRCUIT SUBSTRATE WITH HEAT CONDUCTING ADHESIVE

(75) Inventors: Toshiki Saitoh; Naomi Yonemura; Tomohiro Miyakoshi; Makoto Fukuda, all of Shibukawa (JP)

(73) Assignee: Denki Kagaku Kogyo Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/593,059

(22) Filed: Jun. 13, 2000

Related U.S. Application Data

(62) Division of application No. 08/629,229, filed on Apr. 8, 1996.

(30) Foreign Application Priority Data

| Apr. 12, 1995 | (JP) | 7/87001 |
| Apr. 12, 1995 | (JP) | 7/87002 |
| Apr. 13, 1995 | (JP) | 7/88045 |
| Sep. 12, 1995 | (JP) | 7/234001 |

(51) Int. Cl.7 ................................. H05K 1/16
(52) U.S. Cl. ................. 174/260; 174/252; 174/259; 174/256; 174/255; 361/707; 361/719
(58) Field of Search ................. 174/260, 250, 174/252, 255, 256, 257, 259; 361/704, 707, 719, 720, 713, 779, 777, 761

(56) References Cited

U.S. PATENT DOCUMENTS

| 4,293,592 A | 10/1981 | Morishita et al. ............ 427/98 |
| 4,299,873 A | 11/1981 | Ogihara et al. ............. 428/137 |
| 4,396,936 A | 8/1983 | McIver et al. ................ 357/81 |
| 4,410,927 A | 10/1983 | Butt ........................... 361/386 |
| 4,642,160 A | 2/1987 | Burgess ....................... 156/630 |
| 4,644,130 A | 2/1987 | Bachmann .................. 219/121 |
| 4,767,674 A | 8/1988 | Shirai et al. ................ 428/461 |
| 4,775,414 A | 10/1988 | Shoji ............................ 75/247 |
| 5,108,553 A | 4/1992 | Foster et al. ................ 205/125 |
| 5,272,375 A | 12/1993 | Belopolsky .................. 257/717 |
| 5,285,352 A | 2/1994 | Pastore et al. ............. 361/707 |
| 5,410,449 A | 4/1995 | Brunner ....................... 361/719 |
| 5,488,542 A | 1/1996 | Ito ............................. 361/793 |
| 5,500,785 A | 3/1996 | Funada ........................ 361/720 |
| 5,578,796 A | 11/1996 | Bhatt et al. ................. 174/260 |
| 5,672,414 A | 9/1997 | Okamoto et al. ........... 428/209 |

FOREIGN PATENT DOCUMENTS

| DE | 44 22 216 | 1/1995 |
| EP | 0 247 575 | 12/1987 |
| EP | 0 471 938 | 2/1992 |
| EP | 0 521 720 | 1/1993 |
| EP | 0 525 644 | 2/1993 |
| EP | 0 541 997 | 5/1993 |
| GB | 0 280 782 | 2/1995 |
| JP | 58-9399 | 1/1983 |
| JP | 5-327169 | 12/1993 |

OTHER PUBLICATIONS

JP 1–232795 (abstract and pp. 1, 3, and 5 only), Sep. 1989.
JP 2–286768 (abstracts and pp. 1, 3, 5, and 6 only), Nov. 1990.
JP 4–61193 (abstract and pp. 1, 3, 5, 7, and 8 only), Feb. 1992.
JP 5–167212 (abstract and pp. 1, 3, and 4 only), Jul. 1993.

*Primary Examiner*—K. Cuneo
(74) *Attorney, Agent, or Firm*—Oblon, Spivak, McClelland, Maier & Neustadt, PC

(57) ABSTRACT

A metal-base multilayer circuit substrate which includes a metal plate and a circuit substrate bonded thereon by a first insulating adhesive layer containing at least one of metal oxides and/or at least one of metal nitrides with a heat resistance of at most 2.5° C./W.

13 Claims, 5 Drawing Sheets

METAL-BASE MULTILAYER CIRCUIT SUBSTRATE WITH HEAT CONDUCTING ADHESIVE

This application is a Division of application Ser. No. 08/629,229 filed on Apr. 8, 1996.

The present invention relates to a metal-base multilayer circuit substrate, particularly a metal-base multilayer circuit substrate which has good noise shielding properties and voltage withstanding properties and which is excellent in heat dissipation properties, and a process for its production.

In recent years, with respect to circuit substrates for mounting semiconductors, downsizing, high density packaging and high performance of circuit substrates are required. Further, as the downsizing, high performance and high power trend of semiconductor devices to be mounted on circuit substrates progress, how to dissipate the heat generated by the semiconductor devices has become an important issue.

Mainly in the field of power source, metal-base circuit substrates are being used for the reason that they are excellent in heat dissipation properties. However, such metal-base circuit substrates have a structure wherein metal foils are laminated by means of insulating layers on a metal plate to form circuits, and accordingly, they have had a problem that noises are likely to be generated, and malfunction of the modules is likely to occur.

For the purpose of accomplishing high density packaging by improving heat dissipation properties while shielding noises, a metal-base multilayer circuit substrate has been proposed (Japanese Unexamined Patent Publication No. 327169/1993) wherein an upper layer circuit substrate having circuits on both sides, is laminated by means of an adhesive on the entire surface or a part of a metal-base circuit substrate, and a heat emissive electronic device is mounted on the upper layer circuit substrate.

However, in such a metal-base multilayer circuit substrate, an adhesive layer made of a resin which has a poor heat conductivity, is present between the metal plate and the upper layer circuit substrate, and as the base material, a material having poor heat dissipation properties, such as an epoxy-impregnated glass cloth, is used. Accordingly, when a heat emissive electronic device is mounted on the upper layer circuit of the circuit substrate, there has been a problem that the heat dissipation properties are inadequate, the temperature of the electronic device increases, and malfunction of the module is likely to occur.

The present inventors have conducted various studies with an aim to solve the above problems and as a result, have found it possible to solve the above problems by using an insulating adhesive which has electrical insulating properties, adhesive properties and heat dissipating properties simultaneously and by adopting a structure having no adhesive layer. The present invention has been accomplished on the bases of this discovery.

It is an object of the present invention to provide a metal-base multilayer circuit substrate excellent in heat dissipating properties and voltage withstanding properties by studying and properly setting the structure of the metal-base multilayer circuit substrate and the heat conductivity of an insulating adhesive layer constituting it, and to provide a process whereby such a circuit substrate can be produced with high productivity.

The present invention provides a metal-base multilayer circuit substrate which comprises a metal plate and a circuit substrate bonded thereon by means of a first insulating adhesive layer containing at least one of metal oxides and/or at least one of metal nitrides.

In such a metal-base multilayer circuit substrate, the first insulating adhesive layer preferably has a heat conductivity of from $35\times10^{-4}$ cal/cm·sec·°C. to $150\times10^{-4}$ cal/cm·sec·°C. and a thickness of from 20 $\mu$m to 200 $\mu$m.

Further, the present invention provides such a metal-base multilayer circuit substrate wherein the metal oxide is aluminum oxide or silicon oxide, and the metal nitride is boron nitride.

Further, the present invention provides the metal-base multilayer circuit substrate according to claim 1, wherein a first circuit conductor layer on the circuit substrate has a surface roughness Rz of from 0.1 $\mu$m to 10 $\mu$m on its surface facing the first insulating adhesive layer, particularly such a metal-base multilayer circuit substrate wherein the first circuit conductor layer of the circuit substrate is provided with a plated copper layer on its surface facing the first insulating adhesive layer, more particularly such a metal-base multilayer circuit substrate wherein the plated copper layer contains at least either nickel or cobalt.

Further, the present invention provides the metal-base multilayer circuit substrate according to claim 1, wherein the circuit substrate comprises at least two circuit conductor layers which are bonded by means of a second insulating adhesive layer containing at least one of metal oxides and/or at least one of metal nitrides, preferably such a metal-base multilayer circuit substrate wherein the second insulating adhesive layer has a heat conductivity of from $35\times10^{-4}$ cal/cm·sec·°C. to $150\times10^{-4}$ cal/cm·sec·°C. and a thickness of from 40 $\mu$m to 200 $\mu$m.

Further, the present invention provides the metal-base multilayer circuit substrate according to claim 1, wherein a heat emissive electronic device is mounted on the first insulating adhesive layer by means of a highly heat conductive adhesive, particularly such a metal-base multilayer circuit substrate wherein a metal layer is provided between the first insulating adhesive layer and the highly heat conductive adhesive.

Further, the present invention provides a process for producing a metal-base multilayer circuit substrate as defined in claim 1, which comprises:

(1) a step of bonding a second circuit conductor layer by means of a second insulating adhesive layer on at least a first circuit conductor layer of a metal-base circuit substrate comprising a metal plate and the first circuit conductor layer formed on the metal plate by means of a first insulating adhesive layer, (2) a step of forming a through-hole for electrically connecting the second circuit conductor layer and the first circuit conductor layer, and (3) a step of forming a circuit in the second circuit conductor layer. Preferably in such a process for producing a metal-base multilayer circuit substrate, the first insulating adhesive layer is heat-cured prior to step (2).

Further, the present invention provides such a process for producing a metal-base multilayer circuit substrate, wherein in step (2) for forming the through-hole, a predetermined portion of the second circuit conductor layer is removed by etching to form a hole, and a laser beam is irradiated through the hole to remove the second insulating adhesive layer to form a through-hole, particularly such a process for producing a metal-base multilayer circuit substrate wherein the first circuit conductor layer has a thickness of from 5 $\mu$m to 150 $\mu$m.

In addition, the present invention provides a semiconductor module which comprises a metal-base multilayer circuit substrate as defined in claim 8 and a semiconductor device mounted thereon and wire-bonded by an aluminum wire or a gold wire, preferably such a semiconductor module wherein the first circuit conductor layer facing the first insulating adhesive layer of the circuit substrate is used as a shield pattern.

Now, the present invention will be described in detail with reference to the drawings.

Figure 1:
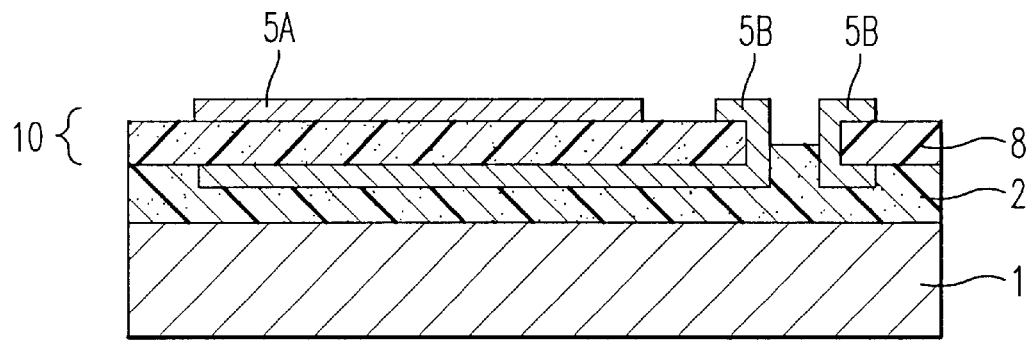
FIG. 1 is a cross-sectional view illustrating one embodiment of the metal-base multilayer circuit substrate of the present invention.

FIG. 1 is a cross-sectional view illustrating one embodiment of the metal-base multilayer circuit substrate of the present invention. Referring to FIG. 1, the metal-base multilayer circuit substrate of the present invention has a structure in which a circuit substrate 10 wherein a metal layer constituting a first circuit conductor layer 5B and a metal layer constituting a second circuit conductor layer 5A are bonded by means of a second insulating adhesive 8, is bonded and integrated on a metal plate 1 by means of a first insulating adhesive layer 2. The second circuit conductor layer 5A which constitutes an upper metal layer of the circuit substrate 10 may be formed in a circuit pattern. Although not shown in the Figure, an electronic device may be mounted thereon, as the case requires, or it may be connected to other devices by e.g. wire bonding. The circuit substrate 10 may be laminated on at least a part of at least one main surface of the metal plate 1. It may have an opening, or a plurality of circuit substrates may further be laminated thereon.

The first insulating adhesive layer 2 is composed of a resin containing at least one of metal oxides and/or at least one of metal nitrides. The metal oxide and the metal nitride preferably have excellent heat conductivity and electrical insulating properties. The metal oxide may, for example, be aluminum oxide or silicon oxide, and the metal nitride may, for example, be boron nitride, silicon nitride or aluminum nitride. These materials may be used alone or in combination as a mixture of two or more of them.

Among the above metal oxides, aluminum oxide is preferred for such reasons that it is thereby possible to readily obtain an insulating adhesive which is excellent in both electrical insulating properties and heat conductivity, and it is readily available at low cost. Among the above metal nitrides, boron nitride is preferred for such a reason that it is excellent in electrical insulating properties and heat conductivity.

The total amount of the metal oxide and/or the metal nitride is from 48 vol % to 80 vol %. If the total amount is less than 48 vol %, it tends to be difficult to bring the heat conductivity of the first insulating adhesive layer 2 to a level of at least $35 \times 10^{-4}$ cal/cm·sec·°C. Consequently, it sometimes becomes impossible to obtain a metal-base multilayer circuit substrate excellent in heat dissipation properties. On the other hand, if it exceeds 80 vol %, air bubbles are likely to be included when they are mixed with a resin. Consequently, it sometimes becomes impossible to obtain a metal-base multilayer circuit substrate excellent in voltage withstanding properties.

The heat conductivity of the first insulating adhesive layer 2 is from $35 \times 10^{-4}$ cal/cm·sec·°C. to $150 \times 10^{-4}$ cal/cm·sec·°C., and the thickness thereof is from 20μm to 200 μm.

If the heat conductivity is less than $35 \times 10^{-4}$ cal/cm·sec·°C., it becomes impossible to obtain a metal-base multilayer circuit substrate having good heat dissipating properties. On the other hand, it is difficult to obtain an insulating adhesive layer having a thermal conductivity exceeding $150 \times 10^{-4}$ cal/cm·sec·°C. on an industrial scale.

In order to obtain a metal-base multilayer circuit substrate having excellent heat dissipating properties certainly by using a first insulating adhesive layer 2 having a thermal conductivity within the above range, the thickness of the first insulating adhesive layer is required to be from 20 μm to 200 μm. If the thickness exceeds 200 μm, it tends to be difficult to accomplish excellent heat dissipation properties, and if it is less than 20 μm, the voltage withstanding properties tend to deteriorate.

As the resin constituting the first insulating adhesive layer 2, a resin is selected for use which has excellent bonding force to the metal plate 1 and to the metal layer constituting the first circuit conductor layer 5B and which does not impair the electrical properties such as voltage withstanding properties. As such a resin, an epoxy resin, a phenol resin, a polyimide resin and various other engineering plastics may be used alone or in combination as a mixture of two or more them. Among them, an epoxy resin is preferred, since it is excellent in the force for bonding metals to each other. Among epoxy resins, a bisphenol A type epoxy resin or a bisphenol F type epoxy resin is more preferred which is excellent in the blending properties with the above metal oxide and/or the metal nitride and which has a high fluidity.

As the metal plate 1, a metal such as aluminum or an aluminum alloy, copper or a copper alloy, or iron or an iron alloy, a double layer composite material such as copper/iron-nickel alloy or aluminum/iron-nickel alloy, or a three layer composite material such as copper/iron-nickel alloy/copper or aluminum/iron-nickel alloy/aluminum, which has excellent heat conductivity, can be used. The thickness of the metal plate 1 is not particularly limited, but is usually from 0.5 mm to 3.0 mm.

The circuit substrate 10 of the present invention preferably comprises at least two metal layers constituting circuit conductor layers bonded by means of a secondary insulating adhesive layer 8 composed of a resin containing at least one of metal oxides and/or at least one of metal nitrides (hereinafter referred to as a double-sided resin substrate). However, conventional glass epoxy resin substrates, paper-phenol resin substrates. or other flexible substrates (hereinafter referred to as resin substrates) may also be employed. Otherwise, a substrate having a circuit formed on a metal plate having an electrical insulating layer provided on its surface (hereinafter referred to as a metal substrate), or a ceramic substrate having a circuit formed on a ceramic plate, may also be employed. For the purpose of increasing the heat dissipation properties of the multilayer circuit portion, the thickness of the base material of the above resin substrate is preferably from 20 $\mu$m to 80 $\mu$m, and the thickness of the metal plate of the metal substrate is preferably from 100 $\mu$m to 1000 $\mu$m.

The heat conductivity of the second insulating adhesive layer 8 constituting the double-sided resin substrate, is from $35 \times 10^{-4}$ cal/cm·sec·°C. to $150 \times 10^{-4}$ cal/cm·sec·°C., and the thickness thereof is from 40 $\mu$m to 200 $\mu$m. If the heat conductivity is less than $35 \times 10^{-4}$ cal/cm·sec·°C., the heat dissipation properties of the resulting metal-base multilayer circuit substrate will be useful only for the limited application. On the other hand, it is difficult to obtain an insulating adhesive layer having a heat conductivity exceeding $150 \times 10^{-4}$ cal/cm·sec·°C. on an industrial scale. If the thickness of the second insulating adhesive layer 8 is less than 40 $\mu$m, the voltage withstanding properties tend to deteriorate, and if it exceeds 200 $\mu$m, the heat dissipation properties tend to be low, whereby the application of the metal-base multilayer circuit substrate will be limited.

The metal oxide and/or the metal nitride in the second insulating adhesive layer 8 of the double-sided resin substrate preferably has excellent heat conductivity and electrical insulting properties. The metal oxide may, for example, be aluminum oxide, silicon oxide, beryllium oxide or magnesium oxide, and the metal nitride may, for example, be boron nitride, silicon nitride or aluminum nitride. These materials may be used alone or in combination as a mixture of two or more of them. As the metal oxide, aluminum oxide or silicon oxide is preferred for such reasons that it is thereby readily possible to obtain an insulating adhesive excellent in both electrical insulating properties and heat conductivity, and it is readily available at low cost. As the metal nitride, boron nitride is preferred, since it is excellent in electrical insulating properties and heat conductivity.

The total amount of the metal oxide and/or the metal nitride in the second insulating adhesive layer 8 of the double-sided resin substrate is from 48 vol % to 80 vol %. If the total amount is less than 48 vol %, it tends to be difficult to bring the heat conductivity of the second insulating adhesive layer 8 to a level of at least $35 \times 10^{-4}$ cal/cm·sec·°C. Consequently, only a metal-base multilayer circuit substrate poor in the heat dissipation properties can be obtained, and thus, the application will be limited. On the other hand, if it exceeds 80 vol %, air bubbles are likely to be included when they are mixed with a resin. Consequently, it sometimes becomes impossible to obtain a metal-base multilayer circuit substrate excellent in voltage withstanding properties.

As the resin constituting the second insulating adhesive layer 8 of the double-sided resin substrate, a resin is selected for use which is excellent in the bonding force to a metal layer constituting the first circuit conductor layer 5B and to a metal layer constituting the second circuit conductor layer 5A and which does not impair the properties of the metal-base multilayer circuit substrate. As such a resin, an epoxy resin, a phenol resin, a polyimide resin and other engineering plastics may be used alone or in combination as a mixture of two or more of them. Among them, an epoxy resin is preferred, since it is excellent in the force for bonding metals to each other. Among epoxy resins, a bisphenol A type epoxy resin or a bisphenol F type epoxy resin is more preferred, since it is excellent in the bonding properties with the metal-oxide and/or the metal nitride and which has a high fluidity.

The material of the metal layers constituting the first circuit conductor layer 5B and the second circuit conductor layer 5A may, for example, be any one of copper, aluminum, nickel, iron, tin, silver and titanium, or an alloy containing two or more of such metals or a clad foil using the respective metals. Such a foil may be prepared by an electrolytic method or a rolling method, and metal plating such nickel (Ni) plating, Ni+gold plating or solder plating, may be applied on the foil.

Figure 2:
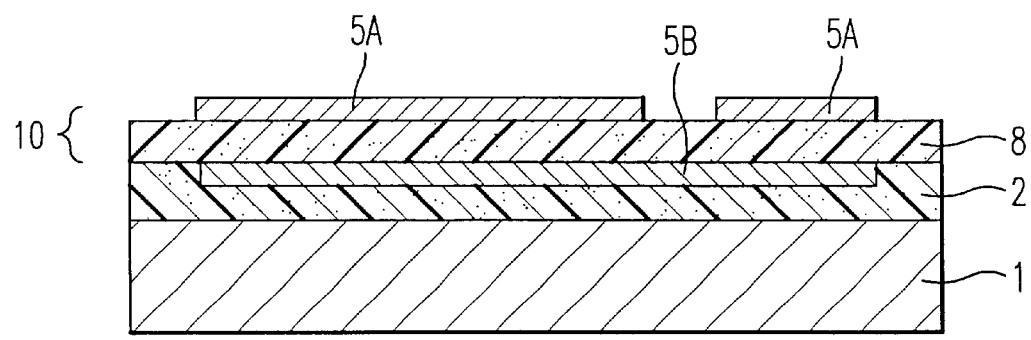
FIG. 2 is a cross-sectional view illustrating another embodiment of the metal-base multilayer circuit substrate of the present invention.

FIG. 2 is a cross-sectional view illustrating another embodiment of the metal-base multilayer circuit substrate of the present invention. The metal-base multilayer circuit substrate of the present invention has a structure in which a circuit substrate 10 having at least a first circuit conductor layer 5B constituting a circuit such as a shield circuit on its lower side and a second circuit conductor layer 5A as its upper layer, is laminated and integrated on a part or the entire surface of at least one main surface of the metal plate 1. Although not shown in the Figure, not only the circuit, but also an electronic device may usually be mounted on the upper side of the circuit substrate 10, as the case requires, and a plurality of other circuit substrates may be further laminated on the circuit substrate 10.

In the present invention, the surface of the first circuit conductor layer 5B on the side which is in contact with the first insulating adhesive layer 2 of the circuit substrate 10 preferably has a surface roughness Rz of from 0.1 $\mu$m to 10 $\mu$m. The circuit substrate 10 is laminated on the metal plate 1 by means of the first insulating adhesive layer 2, whereby the bonding strength is influenced not only by the surface roughness of the circuit formed by the first circuit conductor layer 5B on the first insulating adhesive layer 2, but also by the material and the surface condition of the first circuit conductor and the second insulating adhesive layer 8 on the circuit substrate 10 which is in contact with the first insulating adhesive layer 2. On this point, the present inventors have conducted extensive experimental studies and have found that the surface roughness of the surface of the first circuit conductor layer 5B which is in contact with the first insulating adhesive layer 2 governs the above-mentioned bonding strength, and the bonding strength can be improved particularly when the surface of the first circuit conductor layer 5B is Cu or a plated Cu layer containing at least Ni or Co, and its surface roughness Rz is at least 0.1 $\mu$m. The present invention has been accomplished on the basis of these discoveries.

Figure 3:
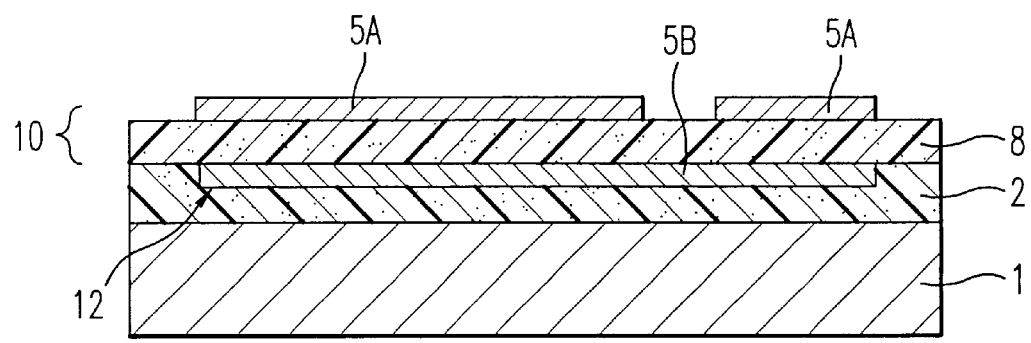
FIG. 3 is a cross-sectional view illustrating still another embodiment of the metal-base multilayer circuit substrate of the present invention.

FIG. 3 is a cross-sectional view illustrating another embodiment of the metal-base multilayer circuit substrate of the present invention, wherein the circuit substrate 10 as a plated Cu layer or a plated Cu alloy layer 12 on the surface of the first circuit conductor layer 5B on the side which is in contact with the first insulating adhesive layer 2.

If the surface roughness Rz of the surface of the first circuit conductor layer 5B of the circuit substrate which is in contact with the first insulating adhesive layer 2, is less than 0.1 μm, no adequate bonding strength tends to be obtained, and a clearance is likely to form between the first circuit conductor layer 5B and the insulating adhesive layer 2 during use or even before use. Consequently, the heat dissipating properties tend to be substantially poor. On the other hand, if the surface roughness Rz exceeds 10 μm, an uneven electric field is likely to form at the roughened portion of the surface, whereby the voltage withstanding properties will be poor. With respect to the material of the surface of the first circuit conductor layer 5B of the circuit substrate 10 which is in contact with the first insulating adhesive layer 2, copper is preferred, since firm bonding strength will be thereby obtained, although the mechanism is not known. Such an effect is remarkable particularly when a plated Cu layer, especially a plated Cu layer containing at least Ni or Co, is laminated.

The material of the first circuit conductor layer 5B which is on the side of the circuit substrate 10 which is in contact with the first insulating adhesive layer 2, is not particularly limited, and it may, for example, be copper, aluminum, nickel, iron, tin, silver, titanium or an alloy of such metals or a clad foil having a plurality of such metals or alloys laminated, or it may be the one having a metal plating such as Ni plating or Ni+gold plating applied thereon. Such a metal or alloy is usually supplied in the form of a thin layered foil having a thickness of from 9 to 500 μm, and its surface roughness Rz is less than 0.1 μm.

In the present invention, the surface of the first circuit conductor layer 5B on the side of the circuit substrate 10 which is in contact with the first insulating adhesive layer 2, is roughened to provide the above-mentioned surface roughness of from 0.1 μm to 10 μm. As a method for adjusting the surface roughness, mechanical processing may be employed. Otherwise, in a case where the first circuit conductor layer on the side of the circuit substrate which is in contact with the first insulating adhesive layer 2, is made of Cu, a conventional surface treatment method such as a method of corrosion treatment with various liquids (etching treatment) or a method of treating with an oxidative liquid (blackening treatment or brown treatment), may be employed.

Further, the present invention is based on a discovery that it is possible to obtain a plated Cu layer having a surface roughness Rz of from 0.1 μm to 10 μm by selecting the conditions for Cu plating. The plated Cu layer or the plated Cu alloy layer (hereinafter referred to simply as a plated Cu layer) 12 formed on the surface of the first circuit conductor layer 5B on the side of the circuit substrate 10 which is in contact with the first insulating adhesive layer 2 of the present invention, is the one which has a surface roughness Rz of from 0.1 μm to 10 μm and which contains at least Ni or Co.

Cu plating or Cu alloy plating may be carried out by electrical Cu plating or electroless Cu plating. In the present invention, either method may be employed so long as the resulting plated layer has a surface roughness Rz of from 0.1 μm to 10 μm. However, electroless Cu plating is preferred in that plated layers of various alloys or surface structures can be thereby obtained.

Electroless Cu plating can readily be carried out by dipping the object to be plated, for example, in an aqueous copper sulfate solution containing formalin, a glyoxylate or sodium hypophosphite as a reducing agent. Here, in order to secure the stability of the electrolyte, a buffer agent such as boric acid or a complexing agent such as sodium citrate, may, for example, be used.

As an example of Cu plating which can be used for the present invention, a method may be mentioned wherein the object to be plated is dipped for a few tens seconds to a few hours under a condition of a bath temperature of from 50 to 70° C. by using a bath having a composition comprising 0.032 M of copper sulfate, 0.27 M of sodium hypophosphite, 0.052 M of sodium citrate and 0.5 M of boric acid as the basic materials and having from 0.001 to 0.01 M of cobalt sulfate or nickel sulfate added, as the case requires. The surface roughness of the plated Cu layer obtained under such plating conditions, may also be adjusted.

The content of Ni and/or Co in the plated Cu layer 12 is not particularly limited, but a content of from 0.1 wt % to 15 wt % is preferred. With respect to the content of Ni and/or Co, the desired amount of at least 0.001 M is added to the electrolyte at the time of Cu alloy plating and is believed to play a role as a nuclei-forming agent at the time when Cu precipitates, and it is believed to be co-precipitated together with Cu. If Ni and/or Co in the plated Cu layer 12 exceeds 15 wt %, the surface roughness of the resulting plated Cu layer 12 may sometimes exceeds 10 μm. Thus, by adjusting the amount of Ni and/or Co to be added, it is readily possible to obtain a plated Cu layer 12 having a surface roughness Rz of from 0.1 μm to 10 μm, without requiring post-treatment.

Likewise, for example, by maintaining the electrolyte temperature at a low level during Cu plating, it is possible to obtain a plated Cu layer 12 which has a surface roughness Rz of from 0.1 μm to 10 μm and which contains neither Ni nor Co. The thickness of the plated Cu layer 12 is preferably from 0.01 to 10 μm, irrespective of whether it contains Ni and/or Co. If the thickness of the plated Cu layer is less than 0.01 μm, no adequate bonding strength will be obtained, and if the thickness exceeds 10 μm, the plated layer is likely to undergo cohesive failure, whereby the desired bonding strength can not be obtained.

Figure 4:
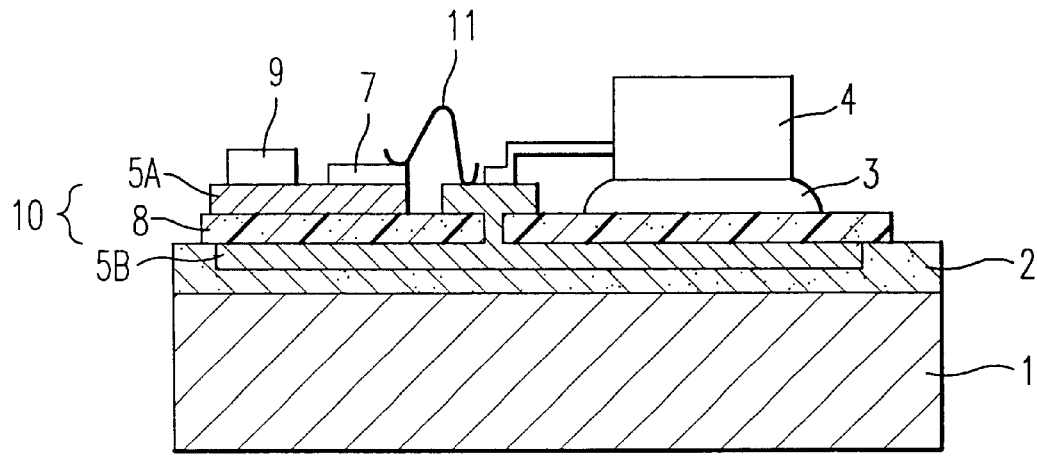
FIG. 4 is a cross-sectional view illustrating a further embodiment of the metal-base multilayer circuit substrate of the present invention.
Figure 5:
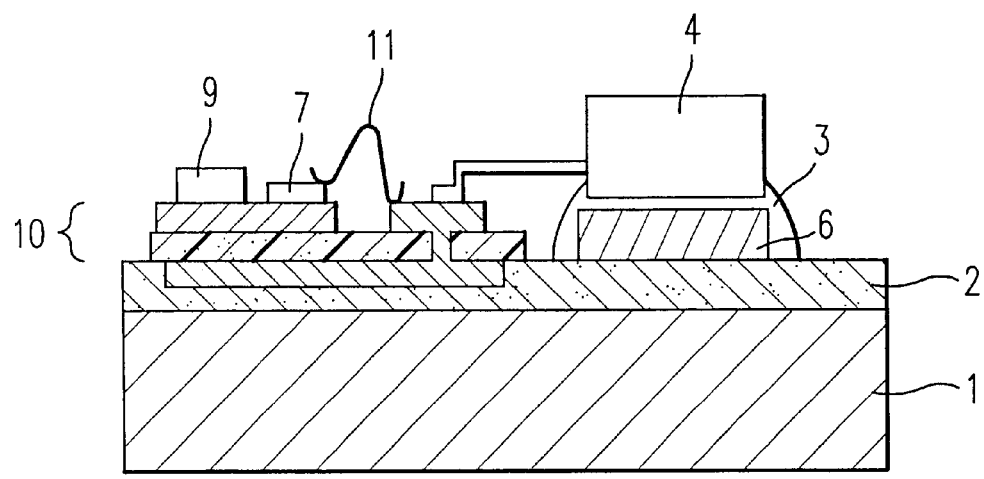
FIG. 5 is a cross-sectional view illustrating a still further embodiment of the metal-base multilayer circuit substrate of the present invention.

FIG. 4 is a cross-sectional view illustrating an embodiment of the structure of the metal-base multilayer circuit substrate of the present invention, and FIG. 5 is a cross-sectional view illustrating another embodiment of the metal-base multilayer circuit substrate according to Claim 2 of the present invention. In FIG. 4, a circuit substrate 10 having a second circuit conductor layer 5A and a first circuit conductor layer 5B and having an opening at a part thereof, is laminated on a metal plate 1 by means of a first insulating adhesive layer 2, and a heat emissive electronic device 4 is mounted on an insulating adhesive layer 8 by means of a highly heat conductive adhesive 3.

FIG. 5 shows a structure in which a metal layer 6 for heat dissipation having a larger heat conductive area than the heat emissive electronic device 4, is formed on the first insulating adhesive layer 2 at a position corresponding to the opening of the circuit substrate 10, and a heat emissive electronic device 4 is mounted thereon by means of a highly heat conductive adhesive 3, so that the heat generated by the heat emissive electronic device 4 can readily be dissipated through the metal layer 6 for heat dissipation. The metal layer 6 may or may not be formed in a circuit pattern.

In the present invention, the heat emissive electronic device 4 may, for example, be a high frequency transformer having a capacity of at least 200 VA with an operating frequency of 200 kHz or a diode bridge having a capacity of at least 100 VA. On the basis of a finding that when the above heat emissive electronic device is mounted on a multilayer circuit portion, the electrical insulating layer present between the circuits acts simultaneously as a heat insulating layer, whereby the heat dissipation properties tend to be inadequate and the temperature of the electronic device rises to shorten the useful life, the present inventors have found that the heat generated by the heat emissive electronic device 4 can adequately be dissipated only when such a heat emissive electronic device 4 is disposed on a metal substrate 1. The present invention has been accomplished on the basis of this discovery. With respect to an electronic device having a small amount of heat emission, such a device may be mounted on the circuit substrate 10 depending upon the characteristics required for the multilayered circuit substrate, or as in the present invention, it may be mounted on the first insulating adhesive layer 2 by means of a highly heat conductive adhesive 3.

In the present invention, the heat emissive electronic device 4 may be disposed on the first insulating adhesive layer 2 without by means of the circuit substrate 10, as mentioned above, so that the heat dissipation is promoted, and the temperature rise of the substrate itself can be suppressed, whereby the reliability of the entire metal-base multilayer circuit substrate can be improved, and long useful life can be accomplished. A plurality of such heat emissive electronic devices may be mounted, depending upon the characteristics required for the multilayer circuit substrate.

Figure 11:
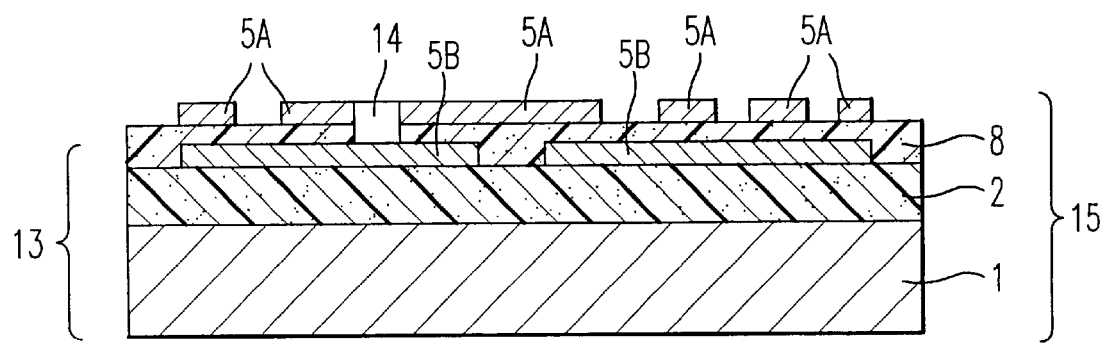
FIG. 11 is a view illustrating another embodiment of the metal-base multilayer circuit substrate of the present invention, which shows the state after step (3) in the process of the present invention.
Figure 12:
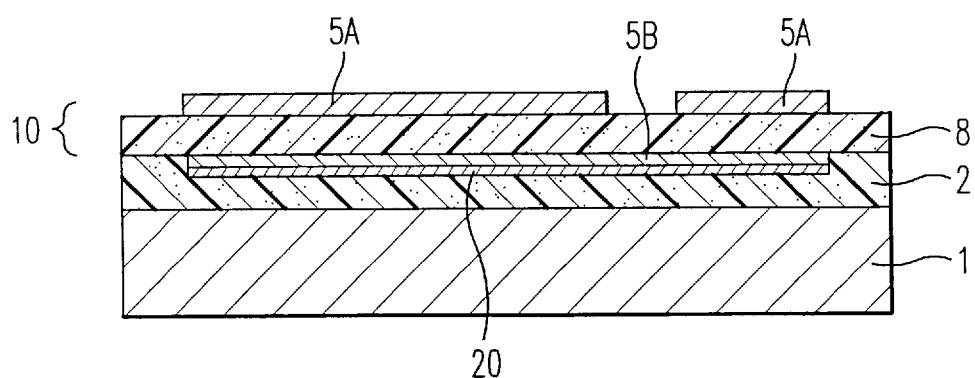
FIG. 12 is identical to FIG. 2, except for the presence of a plated copper layer 20 (not to scale).

Now, FIG. 11 is a cross-sectional view illustrating another embodiment of the metal-base multilayer circuit substrate of the present invention. The metal-base multilayer circuit substrate 15 of the present invention has a structure in which an outer circuit formed by a second circuit conductor layer 5A is laminated and integrated by means of a second insulating adhesive layer 8 on a metal-base circuit substrate 13 wherein a circuit formed by a first circuit conductor layer 5B is mounted on a metal plate 1 by means of a first insulating adhesive layer 2, and the outer circuit and the circuit formed by the first circuit conductor layer 5B are electrically connected through a through-hole 14. Although not shown, an electronic device such as a semiconductor device may be mounted on the outer layer circuit, as the case requires, or the outer layer circuit may be connected to other devices by e.g. wire bonding employing an aluminum wire or a gold wire. Further, the first circuit conductor layer 5B and the circuit formed thereby, and the above-mentioned outer circuit, may be laminated on at least a part of at least one main surface of the metal plate 1, and a plurality of other circuit substrates may further be laminated on the above-mentioned outer layer circuit.

Now, a process for producing the metal-base multilayer circuit substrate of the present invention will be described with reference to the embodiment of the metal-base multi-layer circuit substrate shown in FIG. 11.

Figure 6:
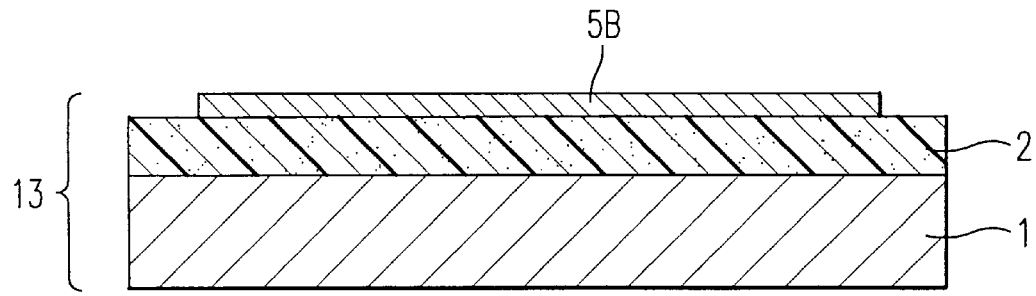
FIG. 6 is a cross-sectional view illustrating a metal-base circuit substrate to be used for the metal-base multilayer circuit substrate of the present invention.
Figure 7:
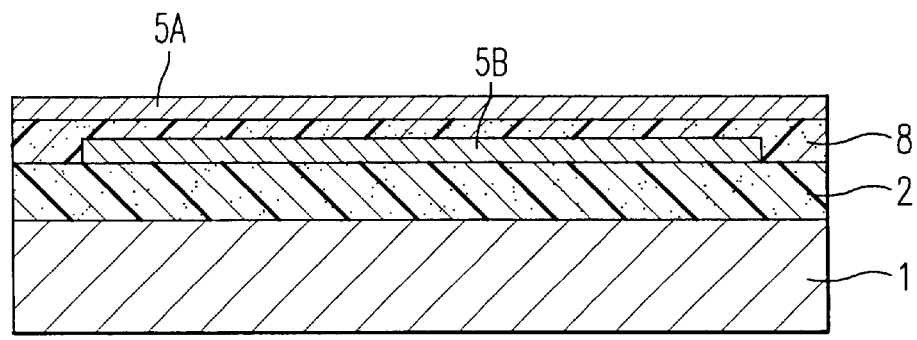
FIG. 7 is a cross-sectional view illustrating an intermediate product after step (1) in the process of the present invention.
Figure 8:
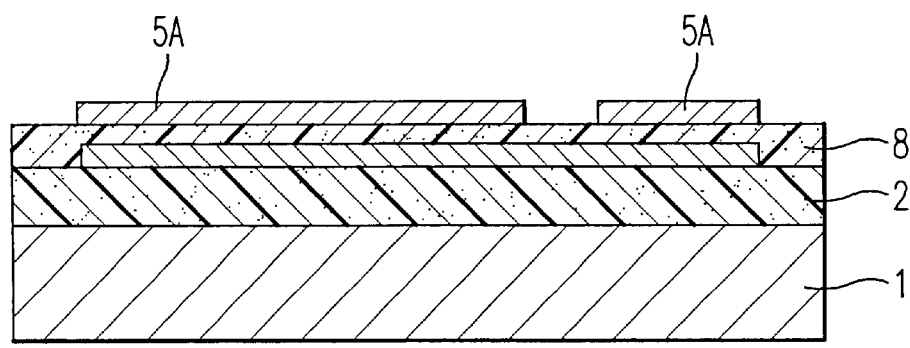
FIG. 8 is a view illustrating one embodiment showing an intermediate point of step (2) in the process of the present invention, which shows a state such that a hole is formed in the second circuit conductor layer.
Figure 9:
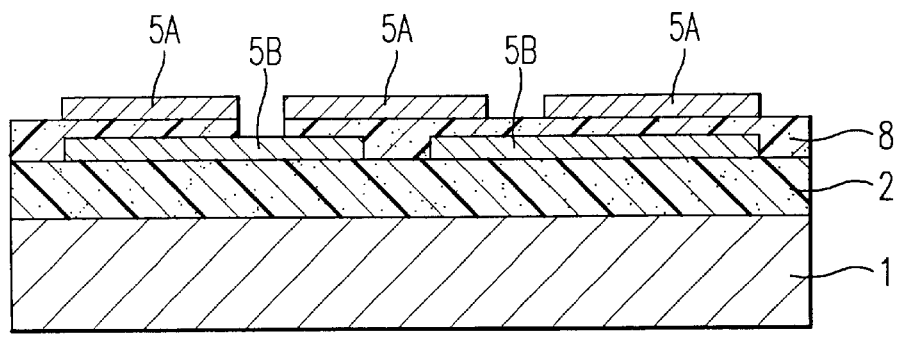
FIG. 9 is a view illustrating another embodiment showing an intermediate point of step (2) in the process of the present invention, which shows a state such that holes are formed in the second circuit conductor layer and the second insulating adhesive layer.
Figure 10:
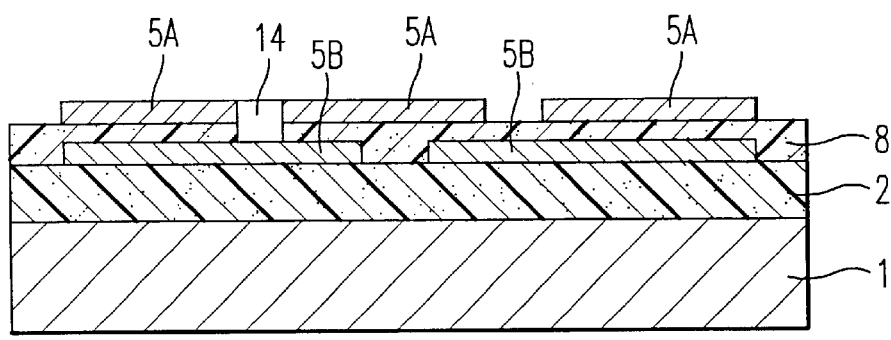
FIG. 10 is a view illustrating one embodiment showing a state after step (2) in the process of the present invention, in which a through-hole has been formed.

The present invention provides a process for producing a metal-base multilayer circuit substrate, which comprises a step (hereinafter referred to as a first step) of bonding a second circuit conductor layer 5A on a first circuit conductor layer 5B of a metal-base circuit substrate 13 by means of a second insulating adhesive layer 8, by using the metal-base circuit substrate 13 shown in FIG. 6, which has the circuit conductor layer 5B formed on a metal plate 1 by means of a first insulating adhesive layer 2. By this step, the metal-base circuit substrate 13 will have a structure shown in FIG. 7. Further, the present invention comprises a step (hereinafter referred to as a second step) of forming a through-hole for electrically connecting the first circuit conductor layer 5B and the second circuit conductor layer 5A. By this step, the structure of FIG. 7 will be modified to a structure having a through-hole 14 as shown in FIG. 10. Further, the present invention comprises a step (hereinafter referred to as a third step) of forming a circuit on the second circuit conductor layer 5A. By this step, the structure shown in FIG. 10 will constitute a metal-base multilayer circuit substrate 15 shown in FIG. 11. FIGS. 8 and 9 are views illustrating the intermediate states in the process for producing the metal-base multilayer circuit substrate of the present invention. FIG. 8 shows a state wherein an intermediate product having a structure shown in FIG. 7 has been processed by the third step. FIG. 9 shows a state where the intermediate product obtained in FIG. 8 has been processed in the second step to remove a part of the second insulating adhesive layer 8, for example, by irradiating a laser.

In the first step of the present invention, a usual metal-base circuit substrate 13 is employed. However, from the viewpoint of the voltage withstanding properties of the resulting metal-base multilayer circuit substrate 15, it is preferred that the first insulating adhesive layer 2 constituting the metal-base circuit substrate 13 is sufficiently heat-cured. Namely, the first insulating adhesive layer 2 of the metal-base circuit substrate 13 becomes to be the first insulating adhesive layer 2 of the metal-base multilayer circuit substrate 15. Accordingly, if the curing is inadequate and, for example, a volatile substance is contained, there will sometimes be a problem such that blistering occurs at the time of curing after coating the second insulating adhesive layer 8, or the voltage withstanding properties of the metal metal-base multilayer circuit substrate 15 tend to deteriorate.

In the first step, it is common to laminate the second circuit conductor layer 5A by means of a heat press or a laminator while the second insulating adhesive layer 8 coated on the metal-base circuit substrate 13 is still in a half cured state, to cure the second insulating adhesive layer 8. In the present invention, the thickness of the first circuit conductor layer 5B is made to be from 5 $\mu$m to 150 $\mu$m, whereby the second insulating adhesive layer 8 penetrates between the circuits formed by the first circuit conductor layer to secure the voltage withstanding properties between the above circuits and the second circuit conductor layer 5A. A metal-base circuit substrate 13 with the thickness of the first circuit conductor layer 5B being less than 5 $\mu$m is not readily available, and if the thickness exceeds 150 $\mu$m, there will be no assurance that a metal-base multilayer circuit substrate 15 excellent in the voltage withstanding properties can certainly be obtained.

According to the present invention, by adopting the above first, second and third steps, it is possible to substantially prevent conventional problems such as blistering and deterioration in the voltage withstanding properties between circuits or between a circuit and the metal plate. Thus, it is possible to improve the productivity. Namely, in the present invention, metal foils excellent in the elasticity and with no circuit formed, are bonded, whereby the voltage withstanding properties between circuits will not be impaired, and blistering can be prevented. Further, a metal-base circuit substrate having insulation from the metal plate preliminarily secured, is used, whereby the voltage withstanding properties between the metal plate and the circuit will not be impaired.

The second step of the present invention is a step of electrically connecting the circuit formed by the first circuit conductor with the second circuit conductor layer 5A by a combination of an operation of forming a through-hole by physically, chemically or mechanically removing a part of the second circuit conductor layer 5A and the second insulating adhesive layer 8 and an operation of filling a conductive substance into the void space thereby formed, by a method such as plating or printing. As a method for forming the through-hole, not only a mechanical processing method employing e.g. a drill but also a method employing various laser beams such as an excimer layer, a $CO_2$ layer or a YAG layer, may be employed. Otherwise, a method may be employed wherein the second insulating adhesive layer 8 is chemically dissolved by chemical drilling. On the other hand, with respect to the method of filling a conductive substance for electrical connection, a plating method such as electroless plating, electrolytic plating or direct plating, application of a conductor coating material, soldering, or a combination of such methods, may be employed. Among these methods, a plating method is preferred, since the productivity is thereby high at low cost.

The present inventors have found that a process which comprises removing a predetermined portion of the second circuit conductor layer 5A or the circuit formed therefrom by etching to form a hole, removing the second insulating adhesive layer 8 by irradiating a laser beam through the hole, followed by plating to form a through-hole, provides a high dimensional precision, thus presents no damage to the peripheral portion and is highly productive. Further, the plating material in the through-hole is preferably the same as the material of the first circuit conductor layer 5B and the second circuit conductor layer 5A, so that the electric resistance with the conductor layers 5B and 5A will not increase, and breakage due to the difference in the thermal expansion from the conductor layers 5B and 5A scarcely takes place. As the material of the first circuit conductor layer 5B and t he second circuit conductor layer 5A, it is common to employ copper having a low electric resistance. Accordingly, it is preferred to employ copper plating to apply plating in the through-hole.

The third step of the present invention is a step of forming a circuit on the second circuit conductor layer 5A bonded to the metal-base circuit substrate 13 in the first step, and a common method for forming a circuit, such as etching, may be employed. In the present invention, so long as the first step is carried out first, the order of the second and third steps may not particularly be restricted, and the second and third steps may be repeated as the case requires to obtain a metal-base multilayer circuit substrate having three or more circuit conductor layers laminated.

In the present invention, as the metal plate 1, a metal such as aluminum or an aluminum alloy, copper or a copper alloy, or iron or an iron alloy, a double layer composite material such as copper/iron-nickel alloy or aluminum/iron-nickel alloy, or a three layer composite material such as copper/iron-nickel alloy/copper, or aluminum/iron-nickel alloy/aluminum, which has excellent heat conductivity, may, for example, be employed. The thickness of the metal plate 1 is not particularly limited, but it is usually from 0.5 mm to 3.0 mm.

Now, the present invention will be described in further detail with reference to Examples. However, it should be understood that the present invention is by no means restricted by such specific Examples.

EXAMPLE 1

A through-hole was formed in a glass epoxy resin circuit substrate (R-1766, manufactured by Matsushita Electric Works, Ltd.) provided on both sides with desired circuits drawn by a copper foil having a thickness of 35 $\mu$m and having a thickness of the glass epoxy resin base material of 60 $\mu$m. Then, using a bisphenol F type epoxy resin (Epikote 807, manufactured by Yuka Shell Co., Ltd.) containing 57 vol % of silicon nitride (SN-9, manufactured by Denki Kagaku Kogyo K.K.) as an insulating adhesive, an amine type curing agent was added thereto, and the mixture was coated on an aluminum plate of 510 mm×510 mm×1.5 mm in a thickness of 200 $\mu$m. Then, the above circuit substrate was laminated thereon, followed by heat-curing to obtain a metal-base multilayer circuit substrate. Separately, using the above insulating adhesive, a heat-cured product of a disc shape having a diameter of 10 mm and a thickness of 2 mm was prepared and used as a test sample for measuring the heat conductivity.

With respect to the metal-base multilayer circuit substrate, the heat resistance and the withstand voltage were measured by the following methods. Further, a module was prepared by assembling three p-mos-FETs (2SK2174S, manufactured by Hitachi, Ltd.) on the above metal-base multilayer circuit substrate with a distance of 2 mm from one another, and the operation stability of the electronic devices was evaluated by the following method for measurement.

As shown in Table 1, the results were all good.

Method for Measuring Heat Resistance

The multilayer portion of the metal-base multilayer circuit substrate is cut out to obtain a test specimen of 40 mm×30 mm. The outermost metal layer in the vicinity of the center of the test specimen is subjected to etching to form a pad portion having a size of 10 mm×14 mm, and a transistor (2SC2233, T0220 type, manufactured by Toshiba Corp.) is soldered to this portion. The rear side of the metal plate is cooled, and the transistor is operated, whereby the heat resistance is calculated from the temperature difference between the rear side of the metal plate and the transistor surface on the insulating adhesive side, and the electric power consumed by the transistor (the energy loss in the collector) (see Denka HITT plate catalogue).

Method for Measuring Heat Conductivity of the Insulating Adhesive

Using a laser flash method heat conductivity measuring apparatus ("LF/TCM-FA-8501B", manufactured by Rigaku Denki Kogyo K.K.), the heat conductivity is measured under such conditions as ATT range: 20 $\mu$V, sampling rate: 1000 $\mu$sec., and filter: 100 Hz.

Method for Measuring Withstand Voltage

Using a circular circuit portion with a diameter of 20 mm, preliminarily prepared in the form of a circuit, the withstand voltage is measured by a stepwise voltage raising method as stipulated in JIS C 2110.

Method for Evaluating Operation Stability of Electronic Devices

The devices are operated continuously for 96 hours so that the consumed power per device would be 10 W at 100° C. If no malfunction occurs, the consumed power is raised by another 10 W, and the test is repeated. In this manner, the consumed power is gradually increased, whereby the operation stability of the electronic devices is evaluated by the consumed power at the time when a malfunction has occurred.

TABLE 1

| | Circuit substrate (second insulating adhesive layer) | | | | | |
|---|---|---|---|---|---|---|
| | | Metal oxide and/or metal nitride | | | | |
| Example | Type | Type | Amount *1 | Resin | HC *2 | TB *3 |
| 1 | Glass epoxy resin substrate | — | — | — | — | 60 |
| 2 | Glass epoxy resin substrate | — | — | — | — | 60 |
| 3 | Glass epoxy resin substrate | — | — | — | — | 60 |
| 4 | Glass epoxy resin substrate | — | — | — | — | 60 |
| 5 | Glass epoxy resin substrate | — | — | — | — | 60 |
| 6 | Glass epoxy resin substrate | — | — | — | — | 60 |
| 7 | Glass epoxy resin substrate | — | — | — | — | 60 |
| 8 | Double-sided resin substrate | Silicon nitride | 63 | Epoxy resin F | 40 | 200 |
| 9 | Double-sided resin substrate | Boron nitride | 53 | Epoxy resin F | 35 | 200 |
| 10 | Double-sided resin substrate | Aluminum oxide | 57 | Epoxy resin F | 37 | 200 |
| 11 | Double-sided resin substrate | Aluminum oxide | 76 | Epoxy resin A | 110 | 60 |

| | First insulating adhesive layer | | | | | | | |
|---|---|---|---|---|---|---|---|---|
| | Metal oxide and/or metal nitride | | | | | | | |
| Example | Type | Amount *1 | Resin | HC *2 | TB *3 | HR *4 | WV *5 | OS *6 |
| 1 | Silicon nitride | 57 | Epoxy resin F | 30 | 200 | 1.5 | >10 | >50 |
| 2 | Boron nitride | 51 | Epoxy resin A | 30 | 200 | 1.5 | >10 | >50 |
| 3 | Aluminum oxide | 54 | Polyimide resin | 32 | 200 | 1.4 | >10 | >50 |
| 4 | Aluminum oxide | 54 | Silicone resin | 32 | 200 | 1.4 | >10 | >50 |
| 5 | Aluminum oxide + Boron nitride | 30 30 | Epoxy resin F | 32 | 200 | 1.4 | >10 | >50 |
| 6 | Silicon nitride | 60 | Epoxy resin F | 35 | 200 | 2.5 | >10 | >50 |
| 7 | Aluminum oxide | 54 | Epoxy resin A | 32 | 200 | 1.4 | >10 | >50 |
| 8 | Aluminum nitride | 61 | Epoxy resin A | 50 | 200 | 1.8 | >10 | >50 |
| 9 | Boron nitride | 53 | Epoxy resin F | 35 | 200 | 2.0 | >10 | >50 |
| 10 | Aluminum oxide | 57 | Epoxy resin F | 37 | 200 | 1.9 | >10 | >50 |
| 11 | Aluminum oxide | 76 | Epoxy resin A | 110 | 20 | 0.4 | 2.2 | >50 |

Note:
*1: vol %,
*2 HC: Heat conductivity ($\times 10^{-4}$ cal/cm · sec · °/C.),
*3 TB: Thickness of base material ($\mu$m),
*4 HR: Heat resistance (° C./W),
*5 WV: Withstand voltage (kV),
*6 OS: Operation stability of electronic device (W)

EXAMPLE 2

A metal-base multilayer circuit substrate was prepared in the same manner as in Example 1 except that a bisphenol A type epoxy resin (Epikote 828, manufactured by Yuka Shell Co., Ltd.) containing 51 vol % of boron nitride (GP, manufactured by Denki Kagaku Kogyo K.K.) was used as the insulating adhesive. With respect to this circuit substrate, the heat resistance and the withstand voltage were measured, and with respect to the module employing this metal-base multilayer circuit substrate, the operation stability of the electronic devices was examined. As shown in Table 1, the results were good.

EXAMPLE 3

A metal-base multilayer circuit substrate and a module employing it were prepared in the same manner as in Example 1 except that a polyimide resin (LARC-TPI, manufacture by Mitsui Toatsu Chemicals, inc.) containing 54 vol % of aluminum oxide (A-42-2, manufactured by Showa Denko K.K.) was used as the insulating adhesive. With respect to the circuit substrate and the module, the heat resistance, the withstand voltage and the operation stability of the electronic devices were examined. As shown in Table 1, the results were good.

EXAMPLE 4

A metal-base multilayer circuit substrate was prepared in the same manner as in Example 1 except that a silicone resin (SE1880, manufactured by Toray Dow Corning Silicone K.K.) containing 54 vol % of aluminum oxide was used as the insulating adhesive. With respect this circuit substrate, the heat resistance was examined and found to be 2.5° C/W. Further, the operation stability of a heat emissive power electronic device was also good with at least 50 W.

EXAMPLE 5

A metal-base multilayer circuit substrate and a module were prepared in the same manner as in Example 1 except that a bisphenol F type epoxy resin containing 30 vol % of aluminum oxide and 30 vol % of boron nitride (GP, manufactured by Denki Kagaku Kogyo K.K.) was used as the insulating adhesive. With respect to the circuit substrate and the module, the heat resistance, the withstand voltage and the operation stability of the electronic devices were examined. As shown in Table 1, the results were good.

EXAMPLE 6

A metal-base multilayer circuit substrate and a module were prepared in the same manner as in Example 1 except that a bisphenol F type epoxy resin containing 60 vol % of silicon nitride powder was used as the insulating adhesive. With respect to the circuit substrate and the module, the heat resistance, the withstand voltage and the operation stability of the electronic devices were examined. As shown in Table 1, the results were good.

EXAMPLE 7

A metal-base multilayer circuit substrate and a module employing it, were prepared in the same manner as in Example 1 except that a bisphenol A type epoxy resin containing 54 vol % of aluminum oxide was used as the insulating adhesive. With respect to the circuit substrate and the module, the heat resistance, the withstand voltage and the operation stability of the electronic devices were examined. As shown in Table 1, the results were good.

EXAMPLE 8

Using a bisphenol F type epoxy resin containing 63 vol % of silicon nitride as an insulating adhesive, an amine type curing agent was added thereto, and the mixture was coated on an aluminum plate of 510 mm×510 mm×0.1 mm in a thickness of 200 μm. Then, a copper foil having a thickness of 35 μm was laminated thereon, followed by heat-curing. Then, the aluminum and the copper were subjected to etching to form desired circuit patterns. Then, a part of the insulating adhesive was cut out from the copper circuit side to expose the aluminum circuit, and the part of the copper circuit and the aluminum circuit were electrically connected by wire bonding to obtain a double-sided resin substrate having circuits on both sides.

Then, a bisphenol A type epoxy resin containing 61 vol % of aluminum nitride (AP10, manufactured by Denki Kagaku Kogyo K.K.) was coated as an insulating adhesive on an aluminum plate of 510 mm×510 mm×1.5 mm in a thickness of 200 μm. Then, the above circuit substrate was laminated thereon so that the aluminum circuit side of the circuit substrate constituted the bonded side, to obtain a metal-base multilayer circuit substrate. With respect to the metal-base multilayer circuit substrate and a module employing it, the heat resistance, the withstand voltage and the operation stability of the electronic devices were examined. As shown in Table 1, the results were good.

EXAMPLE 9

Using a bisphenol F type epoxy resin containing 53 vol % of boron nitride (KBN-10, manufactured by Shin-Etsu Chemical Co., Ltd.) as an insulating adhesive, an amine type curing agent was added thereto, and the mixture was coated on an aluminum plate of 510 mm×510 mm×0.1 mm in a thickness of 200 μm. Then, a copper foil having a thickness of 35 μm was laminated thereon, followed by heat-curing. Then, the aluminum and the copper were subjected to etching to form desired circuit patterns. Then, a part of the insulating adhesive was cut out from the copper circuit side to expose the aluminum circuit, and the part of the copper circuit and the aluminum circuit were electrically connected by wire bonding to obtain a double-sided resin substrate having circuits on both sides.

Then, a bisphenol F type epoxy resin containing 53 vol % of boron nitride was coated as an insulating adhesive on an aluminum plate of 510 mm×510 mm×1.5 mm in a thickness of 200 μm. Then, the above circuit substrate was laminated thereon so that the aluminum circuit side of the circuit substrate constituted the bonded side, to obtain a metal-base multilayer circuit substrate.

With respect to this metal-base multilayer circuit substrate and a module employing it, the heat resistance, the withstand voltage and the operation stability of the electronic devices were examined. As shown in Table 1, the results were good.

EXAMPLE 10

Using a bisphenol F type epoxy resin containing 57 vol % of aluminum oxide as an insulating adhesive, an amine type curing agent was added thereto, and the mixture was coated on a copper foil of 510 mm×510 mm×0.175 mm in a thickness of 200 μm. Then, a copper foil having a thickness of 35 μm was laminated thereon, followed by heat-curing, to obtain a double-sided resin substrate. A through-hole was formed on this double-sided resin substrate, and then a shield pattern was formed on the side of the copper foil having a thickness of 35 μm.

Then, a bisphenol F type epoxy resin (Epikote 807, manufactured by Yuka Shell Co., Ltd) containing 57 vol % of aluminum oxide was coated as an insulating adhesive on an aluminum plate of 510 mm×510 mm×1.5 mm, so that the thickness of the insulating adhesive between the aluminum plate and the above shield pattern would be 200 μm, and the above double-sided resin substrate was laminated thereon so that the shield pattern side of the substrate constituted the bonded side. Then, the copper foil having a thickness of 175 μm was formed into a circuit pattern to obtain a metal-base multilayer circuit substrate.

With respect to this metal-base multilayer circuit substrate and a module employing it, the heat resistance, the withstand voltage and the operation stability of the electronic devices were examined. As shown in Table 1, the results were good.

EXAMPLE 11

Using a bisphenol A type epoxy resin containing 76 vol % of aluminum oxide, an amine type curing agent was added thereto, and the mixture was coated on a copper foil of 510 mm×510 mm×0.175 mm in a thickness of 60 μm. Then, a copper foil having a thickness of 35 μm was laminated thereon, followed by heat-curing to obtain a double-sided resin substrate.

A through-hole was formed on this double-sided resin substrate, and then a shield pattern was formed on the 35 μm copper foil side.

Then, a bisphenol A type epoxy resin containing 76 vol % of aluminum oxide was coated as an insulating adhesive on an aluminum plate of 510 mm×510 mm×1.5 mm, so that the thickness of the insulating adhesive between the aluminum plate and the above shield pattern would be 20 μm, and the above double-sided resin substrate was laminated thereon, so that the shield pattern side constituted the bonded side.

Then, a circuit pattern was formed of the copper foil having a thickness of 175 μm to obtain a metal-base multilayer circuit substrate.

With respect to this metal-base multilayer circuit substrate and a module employing it, the heat resistance, the withstand voltage and the operation stability of electronic devices were examined. As shown in Table 1, the results were good.

EXAMPLE 12

Using a bisphenol F type epoxy resin containing 57 vol % of silicon nitride as an insulating adhesive, an amine type curing agent was added thereto, and the mixture was coated on a copper foil of 510 mm×510 mm×0.175 mm in a thickness of 300 μm. Then, a copper foil having a thickness of 35 μm was laminated thereon, followed by heat-curing to obtain a double-sided resin substrate.

A through-hole was formed on this double-sided resin substrate, and then a shield pattern was formed on the 35 μm copper foil side.

Then, a bisphenol F type epoxy resin containing 57 vol % of aluminum oxide was coated as an insulating adhesive on an aluminum plate of 510 mm×510 mm×1.5 mm, so that the thickness of the insulating adhesive between the aluminum plate and the above-mentioned shield pattern would be 200 μm, and the above double-sided resin substrate was laminated thereon so that the shield pattern side constituted the bonded side. Then, a circuit pattern was formed of the copper foil having a thickness of 175 μm to obtain a metal-base multilayer circuit substrate.

With respect to this metal-base multilayer circuit substrate and a module employing it, the heat resistance, the withstand voltage and the operation stability of electronic devices were examined. As shown in Table 2, the results were good.

TABLE 2

| | | | Circuit substrate (second insulating adhesive layer) | | | | |
| --- | --- | --- | --- | --- | --- | --- | --- |
| | | | Metal oxide and/or metal nitride | | | | |
| | | Type | Type | Amount *1 | Resin | HC *2 | TB *3 |
| Example | 12 | Double-sided resin substrate | Silicon nitride | 57 | Epoxy resin F | 30 | 300 |
| | 13 | Double-sided resin substrate | Silicon nitride | 57 | Epoxy resin F | 30 | 300 |
| | 14 | Double-sided resin substrate | Aluminum nitride | 55 | Epoxy resin F | 35 | 200 |
| | 15 | Double-sided resin substrate | Silicon nitride | 57 | Epoxy resin F | 30 | 60 |
| | 16 | Double-sided resin substrate | Silicon nitride | 57 | Epoxy resin F | 30 | 60 |
| | 17 | Double-sided resin substrate | Silicon nitride | 60 | Epoxy resin F | 35 | 60 |
| | 18 | Double-sided resin substrate | Silicon nitride | 60 | Epoxy resin F | 35 | 60 |
| | 19 | Double-sided resin substrate | Silicon nitride | 60 | Epoxy resin F | 35 | 60 |
| Comparative Example | 1 | Glass epoxy resin substrate | — | — | — | — | 100 |
| | 2 | Glass epoxy resin substrate | — | — | — | — | 60 |

| | | First insulating adhesive layer | | | | | | |
| --- | --- | --- | --- | --- | --- | --- | --- | --- |
| | | Metal oxide and/or metal nitride | | | | | | |
| | | Type | Amount *1 | Resin | HC *2 | TB *3 | HR *4 | WV *5 | OS *6 |
| Example | 12 | Aluminum oxide | 57 | Epoxy resin F | 37 | 200 | 2.3 | >10 | >50 |
| | 13 | Aluminum nitride | 54 | Epoxy resin A | 35 | 200 | 1.3 | >10 | >50 |
| | 14 | Aluminum oxide | 57 | Epoxy resin F | 37 | 200 | 1.9 | >10 | >50 |
| | 15 | Aluminum oxide | 44 | Epoxy resin F | 20 | 20 | 0.8 | 2.0 | >50 |
| | 16 | Silicon nitride | 57 | Epoxy resin F | 30 | 20 | 0.6 | 2.0 | >50 |
| | 17 | Aluminum oxide | 76 | Epoxy resin F | 110 | 20 | 0.4 | 2.2 | >50 |
| | 18 | Aluminum oxide | 54 | Epoxy resin F | 32 | 20 | 0.6 | 2.2 | >50 |
| | 19 | Aluminum nitride | 52 | Epoxy resin F | 34 | 20 | 0.5 | 2.2 | >50 |
| Comparative Example | 1 | (Adhesive sheet + the following insulating layer) | | | 150 | 3.4 | >10 | 20 |
| | 1 | Aluminum oxide | 76 | Epoxy resin F | 110 | | | | |
| | 2 | (Glass epoxy prepreg) | | | 6 | 100 | 3.8 | 7.8 | 20 |

*1; vol %,
*2 HC: Heat conductivity (×10$^{-4}$ cal/cm · sec · °/C.),
*3 TB: Thickness of base material (μm),
*4 HR: Heat resistance (° C./W),
*5 WV: Withstand voltage (kV),
*6 OS: Operation stability of electronic device

EXAMPLE 13

A double-sided resin substrate was prepared as in Example 12. Then, a bisphenol A type epoxy resin containing 54 vol % of aluminum nitride was coated as an insulating adhesive on an aluminum plate of 510 mm×510 mm×1.5 mm, so that the thickness of the insulating adhesive between the aluminum plate and the shield pattern would be 200 $\mu$m, and the above double-sided resin substrate was laminated thereon so that the shield pattern side constituted the bonded side. Then, a circuit pattern was formed of the copper foil having a thickness of 175 $\mu$m to obtain a metal-base multilayer circuit substrate.

With respect to this metal-base multilayer circuit substrate and a module employing it, the heat resistance, the withstand voltage and the operation stability of electronic devices were examined. As shown in Table 2, the results were good.

EXAMPLE 14

Using a bisphenol F type epoxy resin containing 55 vol % of aluminum nitride as an insulating adhesive, an amine curing agent was added thereto, and the mixture was coated on a copper foil of 510 mm×510 mm×0.175 mm in a thickness of 200 $\mu$m. Then, a copper foil having a thickness of 35 $\mu$m was laminated thereon, followed by heat-curing to obtain a double-sided resin substrate. A through-hole was formed on this double-sided resin substrate, and then a shield pattern was formed on the 35 $\mu$m copper foil side.

Then, a bisphenol F type epoxy resin containing 57 vol % of aluminum oxide was coated as an insulating adhesive on an aluminum plate of 510 mm×510 mm×1.5 mm, so that the thickness of the insulating adhesive between the aluminum plate and the above shield pattern would be 10 $\mu$m, and the above double-sided resin substrate was laminated so that the shield pattern side constituted the bonded side. Then, a circuit pattern was formed on the 175 $\mu$m copper foil side to obtain a metal-base multilayer circuit substrate.

With respect to this metal-base multilayer circuit substrate and a module employing it, the heat resistance, the withstand voltage and the operation stability of electronic devices were examined. As shown in Table 2, the results were good.

EXAMPLE 15

Using a bisphenol F type epoxy resin containing 57 vol % of silicon nitride as an insulating adhesive, an amine type curing agent was added thereto, and the mixture was coated on a copper foil of 510 mm×510 mm×0.175 mm in a thickness of 60 $\mu$m. Then, a copper foil having a thickness of 35 $\mu$m was laminated thereon, followed by heat-curing to obtain a double-sided resin substrate. A through-hole was formed on this double-sided resin substrate, and then a shield pattern was formed on the 35 $\mu$m copper foil side.

Then, a bisphenol F type epoxy resin containing 44 vol % of aluminum oxide was coated as an insulating adhesive on an aluminum plate of 510 mm×510 mm×1.5 mm, so that the thickness of the insulating adhesive between the aluminum plate and the above shield pattern would be 20 $\mu$m, and the above double-sided resin substrate was laminated so that the shield pattern side constituted the bonded side. Then, a circuit pattern was formed on the 175 $\mu$m copper foil side to obtain a metal-base multilayer circuit substrate.

With respect to this metal-base multilayer circuit substrate and a module employing it, the heat resistance, the withstand voltage and the operation stability of electronic devices were examined. As shown in Table 2, the results were good.

EXAMPLE 16

A double-sided resin substrate was prepared in the same manner as in Example 15. Then, a bisphenol F type epoxy resin containing 57 vol % of silicon nitride was coated as an insulating adhesive on an aluminum plate of 510 mm×510 mm×1.5 mm, so that the thickness of the insulating adhesive between the aluminum plate and the above shield pattern would be 20 $\mu$m, and the above double-sided resin substrate was laminated thereon so that the shield pattern side constituted the bonded side. Then, a circuit pattern was formed on the 175 $\mu$m copper foil side to obtain a metal-base multilayer circuit substrate.

With respect to this metal-base multilayer circuit substrate and a module employing it, the heat resistance, the withstand voltage and the operation stability of electronic devices were examined. As shown in Table 2, the results were good.

EXAMPLE 17

Using a bisphenol F type epoxy resin containing 60 vol % of silicon nitride as an insulating adhesive, an amine type curing agent was added thereto, and the mixture was coated on a copper foil of 510 mm×510 mm×0.175 mm in a thickness of 60 $\mu$m. Then, a copper foil having a thickness of 35 $\mu$m was laminated thereon, followed by heat-curing to obtain a double-sided resin substrate. A through-hole was formed in this double-sided resin substrate, and then a shield pattern was formed on the 35 $\mu$m copper foil side.

Then, a bisphenol F type epoxy resin containing 76 vol % of aluminum oxide was coated as an insulating adhesive on an aluminum plate of 510 mm×510 mm×1.5 mm, so that the thickness of the insulating adhesive between the aluminum plate and the above shield pattern would be 20 $\mu$m, and the above double-sided resin substrate was laminated thereon so that the shield pattern side constituted the bonded side. Then, a circuit pattern was formed on the 175 $\mu$m copper foil side to obtain a metal-base multilayer circuit substrate.

With respect to this metal-base multilayer circuit substrate and a module employing it, the heat resistance, the withstand voltage and the operation stability of electronic devices were examined. As shown in Table 2, the results were good.

EXAMPLE 18

A double-sided resin substrate was prepared in the same manner as in Example 17. Then, a bisphenol F type epoxy resin containing 54 vol % of aluminum oxide was coated as an insulating adhesive on an aluminum plate of 510 mm×510 mm×1.5 mm, so that the thickness of the insulating adhesive between the aluminum plate and the above shield pattern would be 20 $\mu$m, and the above double-sided resin substrate was laminated thereon so that the shield pattern side constituted the bonded side. Then, a circuit pattern was formed on the 175 $\mu$m copper foil side to obtain a metal-base multilayer circuit substrate.

With respect to this metal-base multilayer circuit substrate and a module employing it, the heat resistance, the withstand voltage and the operation stability of electronic devices were examined. As shown in Table 2, the results were good.

EXAMPLE 19

A double-sided resin substrate was prepared in the same manner as in Example 17. Then, a bisphenol F type epoxy resin containing 52 vol % of aluminum nitride was coated as an insulating adhesive on an aluminum plate of 510 mm×510 mm×1.5 mm, so that the thickness of the insulating adhesive between the aluminum plate and the above shield pattern would be 20 $\mu$m, and the above double-sided resin substrate was laminated thereon so that the shield pattern side constituted the bonded side. Then, a circuit pattern was formed on the 175 μm copper foil side to obtain a metal-base multilayer circuit substrate.

With respect to this metal-base multilayer circuit substrate and a module employing it, the heat resistance, the withstand voltage and the operation stability of electronic devices were examined. As shown in Table 2, the results were good.

COMPARATIVE EXAMPLE 1

A bisphenol F type epoxy resin containing 76 vol % of aluminum oxide was coated as an-insulating adhesive layer on an aluminum plate of 510 mm×510 mm×1.5 mm in a thickness of 150 μm. Then, a copper foil having a thickness of 35 μm was laminated thereon, followed by heat curing. Then, the copper foil was removed by etching to obtain an insulating substrate for a circuit substrate.

On the other hand, a through-hole was formed in a glass epoxy resin circuit substrate which has a thickness of the base material of 100 μm and which has desired circuit patterns having a foil thickness of 35 μm on both sides of the base material.

Then, the above glass epoxy resin circuit substrate was laminated by means of an adhesive sheet (Pyralux, manufactured by Du Pont Co., Ltd.) having a thickness of 50 μm on the insulating layer of the above insulating substrate for a circuit substrate, to obtain a metal-base multilayer circuit substrate.

With respect to this metal-base multilayer circuit substrate and a module employing it, the heat resistance, the withstand voltage and the operation stability of electronic devices were examined. As shown in Table 2, the heat resistance was high, and the stability of electronic devices was poor, although it was excellent in the voltage withstanding properties.

Further, the heat conductivity was measured with respect to a cured product of the above insulating adhesive.

COMPARATIVE EXAMPLE 2

A through-hole was formed on a glass epoxy resin circuit substrate which has a thickness of the base material of 60 μm and which has desired circuit patterns having a foil thickness of 35 μm on both sides of the base material.

Then, the above glass epoxy resin circuit substrate was laminated on an aluminum plate of 510 mm×510 mm×1.5 mm using a glass epoxy prepreg having a thickness of 100 μm as an insulating adhesive, to obtain a metal-base multilayer circuit substrate.

With respect to this metal-base multilayer circuit substrate and a module employing it, the heat resistance, the withstand voltage and the operation stability of electronic devices were examined. As shown in Table 2, the heat resistance was high and the stability of electronic devices was poor, although it was excellent in the voltage withstanding properties.

EXAMPLE 20

An epoxy resin containing 78 wt % of pulverized aluminum oxide was coated as an insulating adhesive layer on an aluminum plate having a thickness of 1.5 mm in a thickness of 200 μm. On the other hand, desired circuits and a through-hole were formed in a glass epoxy resin substrate which has a thickness of a base material of 60 μm and which has metal layers having a thickness of 35 μm on both sides. Then, the circuit on one side was subjected to etching treatment to roughen the surface, and Cu plating treatment was applied. Here, the surface roughness Rz of the plated Cu layer was 0.1 μm.

Then, the substrate was directly laminated on the insulating adhesive layer on the above aluminum plate so that the Cu-plated circuit faced the above insulating adhesive layer, to obtain a metal-base multilayer circuit substrate.

With respect to this metal-base multilayer circuit substrate, the bonding strength between the insulating adhesive layer and the circuit substrate was examined by a 90° peeling method in accordance with JIS C6481. Further, the same metal-base multilayer circuit substrate was floated on a solder bath of 260° C. and treated for 60 minutes, whereupon the bonding strength and the presence or absence of blistering were examined. The 90° peel strength before and after the treatment in the solder bath was good at a level of 1.9 and 1.8 kgf/cm, respectively. Further, no blistering was observed.

EXAMPLES 21 TO 26 AND COMPARATIVE EXAMPLE 3

With respect to various metal-base multilayer circuit substrates obtained in the same manner as in Example 20 except that the conditions for preparing the plated Cu layer were changed variously, the same evaluations as in Example 20 were carried out, and identified as Examples 21 to 26.

COMPARATIVE EXAMPLE 3

As a Comparative Example, the same operation and evaluations were carried out with respect to the one having no plated Cu layer provided and having no surface roughening by etching applied. The results are shown in Table 3 together with the results of Example 20.

EXAMPLE 27

An epoxy resin containing 78 wt % of pulverized aluminum oxide was coated as an insulating adhesive layer on an aluminum plate having a thickness of 1.5 mm in a thickness of 200 μm. On the other hand, desired circuits and a through-hole were formed in a glass epoxy resin substrate which had a thickness of the base material of 60 μm and which had metal layers having a thickness of 35 μm on both sides. Then, the circuit on one side was subjected to blackening treatment with an alkaline aqueous solution containing a chlorite as the main agent. Here, the surface roughness Rz of the blackening treated circuit was 0.2 μm.

Then, the substrate was directly laminated on the insulating adhesive layer of the above aluminum plate by a lamination method so that the blackening treated circuit faced the above insulating adhesive layer, to obtain a metal-base multilayer circuit substrate.

With respect to this metal-base multilayer circuit substrate, the same evaluations as in Example 20 were carried out. The results are shown in Table 3.

EXAMPLE 28

With respect to a metal-base multilayer circuit substrate prepared in the same manner as in Example 8 except that instead of the blackening treatment, etching treatment was applied with a sulfuric acid-hydrogen peroxide aqueous solution, the same evaluations as in Example 20 were carried out. The results are shown in Table 3.

TABLE 3

| | | Surface treatment method | Plated Cu layer Composition (wt %) | Plated Cu layer Thickness (μm) | Surface roughness (μm) | Peel strength (kgf/cm) Initial | Peel strength (kgf/cm) After heating | Blistering |
|---|---|---|---|---|---|---|---|---|
| Example | 20 | Cu plating | — | 0.05 | 0.10 | 1.9 | 1.8 | No |
| | 21 | Cu plating | Co: 4.0 | 9.1 | 0.21 | 2.1 | 1.8 | No |
| | 22 | Cu plating | Co: 4.0 | 9.5 | 9.2 | 2.4 | 1.9 | No |
| | 23 | Cu plating | Ni: 2.0 | 9.6 | 8.7 | 2.2 | 2.0 | No |
| | 24 | Cu plating | Ni: 2.0 +Co: 4.0 | 5.0 | 4.2 | 2.1 | 2.0 | No |
| | 25 | Cu plating | Co: 0.1 | 3.2 | 2.4 | 1.5 | 0.9 | No |
| | 26 | Cu plating | Ni: 12.0 | 5.6 | 4.8 | 1.7 | 1.4 | No |
| | 27 | Blackening | | | 0.2 | 2.2 | 0.4 | No |
| | 28 | Etching | | | 0.2 | 1.8 | 0.8 | No |
| Comparative Example | 3 | Non-treatment | | | 0.004 | 0.9 | 0.2 | Present |

EXAMPLE 29

A through-hole was formed in a glass epoxy circuit substrate (R-1766, manufactured by Matsushita Electric Works, Ltd.) which was provided on both sides with desired circuits drawn by a copper foil having a thickness of 35 μm and which had a thickness of the glass epoxy material of 60 μm. Then, using a bisphenol F type epoxy resin (Epikote 807, manufactured by Yuka Shell Co., Ltd.) containing 72 vol % of silicon oxide (FS-784, manufactured by Denki Kagaku Kogyo K.K.) as an insulating adhesive, an amine type curing agent was added thereto, and the mixture was coated on an aluminum plate of 510 mm×510 mm×1.5 mm in a thickness of 150 m. Then, the circuit substrate was laminated thereon, followed by heat curing to obtain a substrate base sheet.

Using this substrate base sheet, a DC/DC converter having a substrate size of 100×150 mm, an output electric power of 150 W and an operation frequency of 300 kHz, was prepared. An electronically controlled device was disposed on the circuit of the glass epoxy circuit substrate in order to reduce the influence of the unwanted capacitance of the substrate, and a high frequency transformer (capacity: 150 VA, manufactured by TDK Corp.) as a heat emissive device was fixed on the insulating adhesive layer by a silicone adhesive.

This module was operated at a room temperature of 25° C. for 5 hours, whereby the temperature on the rear side of the substrate was measured and found to be 112° C. During this period, the module was functionally stably operated.

EXAMPLE 30

A substrate base sheet was prepared in the same manner as in Example 29. By using this substrate base sheet, a DC/DC converter having a substrate size of 100×150 mm, an output power of 150 W and an operational frequency of 300 kHz, was prepared. An electronically controlled device was disposed on the circuit of the glass epoxy circuit substrate in order to reduce the influence of the unwanted capacitance of the substrate, and a high frequency transformer (capacity: 150 VA, manufactured by TDK Corp.) as a heat emissive device was fixed on the circuit on the insulating adhesive layer by a silicone adhesive. Here, the high frequency transformer and the circuit pattern were electrically insulated.

This module was operated at a room temperature of 25° C. for 5 hours, whereby the temperature on the rear side of the substrate was measured and found to be 107° C., and the module was functionally stably operated.

EXAMPLE 31

A through-hole was formed in a double-sided resin substrate having a thickness of 100 μm, which was provided on both sides with desired circuits drawn by a copper foil having a thickness of 35 μm and which was prepared by heat curing a bisphenol A type epoxy resin (Epikote 828, manufactured by Yuka Shell Co., Ltd.) containing 72 vol % of aluminum oxide with an amine type curing agent. Then, using a bisphenol F type epoxy resin containing 72 vol % of aluminum oxide as an insulating adhesive, an amine type curing agent was added thereto, and the mixture was coated on an aluminum plate of 510 mm×510 mm×1.5 mm in a thickness of 150 μm. Then, the substrate was laminated thereon, followed by heat curing to obtain a substrate base sheet.

Then, using this substrate base sheet, a DC/DC converter having a substrate size of 100 mm×150 mm, an output power of 250 W and an operational frequency of 300 kHz, was prepared. An electronically controlled device was disposed on the circuit of the double-sided resin substrate in order to reduce the influence of the unwanted capacitance of the substrate, and a high frequency transformer (capacity: 250 VA, manufactured by TDK Corp.) as a heat emissive device was fixed on the insulating adhesive layer by a silicone adhesive.

This module was operated at a room temperature of 25° C. for 5 hours, whereby the temperature on the rear side of the substrate was measured and found to be 108° C., and the module was functionally stably operated.

EXAMPLE 32

A through-hole was formed in a double-sided resin substrate having a thickness of 100 μm, which was provided on both sides with desired circuits drawn by a copper foil having a thickness of 35 μm and which was prepared by heat curing a bisphenol F type epoxy resin containing 72 vol % of silicon oxide with an amine type curing agent. Then, using a bisphenol F type epoxy resin containing 36 vol % of silicon oxide and 36 vol % of boron nitride, as an insulating adhesive, an amine type curing agent was added thereto, and the mixture was coated on an aluminum plate of 510 mm×510 mm×1.5 mm in a thickness of 150 μm. Then, the substrate was laminated thereon, followed by heat curing to obtain a substrate base sheet.

Using this substrate base sheet, a DC/DC converter having a substrate size of 100 mm×150 mm, an output power of 150 W and an operational frequency of 300 kHz, was prepared. An electronically controlled device was disposed on the circuit pattern on the double-sided resin substrate in order to reduce the influence of the unwanted capacitance of the substrate, and a high frequency transformer (capacity: 250 VA, manufactured by TDK Corp.) as a heat emissive electronic device was fixed on the circuit on the insulating adhesive layer by a silicone adhesive.

This module was operated at a room temperature of 25° C. for 5 hours, whereby the temperature on the rear side of the substrate was measured and found to be 105° C., and the module was functionally stably operated.

COMPARATIVE EXAMPLE 4

A bisphenol F type epoxy resin containing 76 vol % of aluminum oxide was coated as an insulating adhesive layer on an aluminum plate of 510 mm×510 mm×1.5 mm in a thickness of 150 $\mu$m. Then, a copper foil having a thickness of 35 $\mu$m was laminated thereon, followed by heat curing. Then, the copper foil was removed by etching to obtain an insulating substrate for a circuit substrate.

On the other hand, a through-hole was formed in a glass epoxy resin circuit substrate which had a thickness of the base material of 100 $\mu$m and which had desired circuit patterns having a foil thickness of 35 $\mu$m on both sides of the base material.

Then, the above glass epoxy resin circuit substrate was laminated by means of an adhesive sheet having a thickness of 50 $\mu$m (Pyralux, manufactured by Du Pont Co., Ltd.) on the insulating layer of the above insulating substrate for a circuit substrate, to obtain a metal-base multilayer circuit substrate.

Using this substrate base sheet, a DC/DC converter having a substrate size of 100 mm×150 mm, an output power of 150 W and an operational frequency of 300 kHz, was prepared. An electronically controlled device was disposed on the circuit on the glass epoxy circuit substrate, and a high frequency transformer (capacity: 150 VA, manufactured by TDK Corp.) as a heat emissive electronic device was fixed on the glass epoxy circuit substrate by a silicone adhesive.

This module was operated at a room temperature of 25° C. for 5 hours, whereby the temperature on the rear side of the substrate was measured and found to be 193° C., and the change in the output voltage was large, and the operation was unstable.

COMPARATIVE EXAMPLE 5

A through-hole was formed in a glass epoxy circuit substrate which was provided on both sides with desired circuits drawn by a copper foil having a thickness of 35 $\mu$m and which had a thickness of the glass epoxy material of 60 $\mu$m. Then, using a bisphenol F type epoxy resin containing 72 vol % of silicon oxide as an insulating adhesive, an amine type curing agent was added thereto, and the mixture was coated on an aluminum plate of 510 mm×510 mm×1.5 mm in a thickness of 150 $\mu$m. Then, the circuit substrate was laminated thereon, followed by heat curing to obtain a substrate base sheet.

Using this substrate base sheet, a DC/DC converter having a substrate size of 100 mm×150 mm, an output power of 150 W and an operational frequency of 300 kHz, was prepared. An electronically controlled device was disposed on the circuit of the glass epoxy circuit substrate, and a high frequency transformer (capacity: 150 VA, manufactured by TDK Corp.) as a heat emissive electronic device was fixed on the glass epoxy circuit substrate by a silicone adhesive.

This module was operated at a room temperature of 25° C. for 5 hours, whereby the temperature on the rear side of the substrate was measured and found to be 163° C., and the change in the output voltage was large, and the operation was unstable.

The results of the foregoing Examples 29 to 32 and Comparative Example 4 and 5 are shown in Table 4.

TABLE 4

| | | Type of circuit substrate | Output of heat emissive electronic device (W) | Position at which the heat emissive electronic device was mounted | Temp. on the rear side of the metal plate (° C.) | Operation stability |
|---|---|---|---|---|---|---|
| Example | 29 | Glass epoxy circuit substrate | 150 | On the insulating adhesive layer | 112 | Normal |
| | 30 | Glass epoxy circuit substrate | 150 | On the metal layer on the insulating adhesive layer | 107 | Normal |
| | 31 | Double-sided resin substrate | 250 | On the insulating adhesive layer | 108 | Normal |
| | 32 | Double-sided resin substrate | 250 | On the metal layer on the insulating adhesive layer | 105 | Normal |
| Comparative Example | 4 | Glass epoxy circuit substrate | 150 | On the upper metal layer of the circuit substrate | 193 | Unstable |
| | 5 | Glass epoxy circuit substrate | 150 | On the upper metal layer of the circuit substrate | 163 | Unstable |

EXAMPLE 33

Using a bisphenol F type epoxy resin (Epikote 807, manufactured by Yuka Shell Co., Ltd.) containing 53 vol % of boron nitride (GP, manufactured by Denki Kagaku Kogyo K.K.) as an insulating adhesive, an amine type curing agent was added thereto, and the mixture was coated on an aluminum plate of 510 mm×510 mm×1.5 mm in a thickness of 200 $\mu$m. Then, a copper foil having a thickness of 35 $\mu$m was laminated thereon by a lamination method. Then, a shield pattern was formed on this copper foil. Then, an amine type curing agent was added to the above insulating adhesive, and the mixture was coated on the copper foil in a thickness of 200 μm. Further, a copper foil having a thickness of 35 μm was laminated thereon by a lamination method, followed by heat curing. Then, at a predetermined position of the outer copper foil, a round hole having a diameter of 0.5 mm was formed by a drill and drilled to the second insulating adhesive layer. Then, copper plating was applied to form a through-hole. On this surface, a desired circuit was formed by etching to obtain a metal-base multilayer circuit substrate.

With respect to this metal-base multilayer circuit substrate, the heat resistance, the withstand voltage and the operation stability of electronic devices were measured, and the productivity was further measured by the following method. As shown in Table 5, the results were good.

Further, a heat cured product of a disc shape having a diameter of 10 mm and a thickness of 1 mm was separately prepared from the insulating adhesive and used as a test specimen for measuring the heat conductivity by a laser method.

Method for Evaluating the Productivity

The productivity was evaluated by the time required for producing 10,000 sheets of a substrate having a name card size (90 mm×55 mm).

EXAMPLE 34

A metal-base multilayer circuit substrate was prepared in the same manner as in Example 33 except that a silicone resin (SE1880, manufactured by Toray Dow Corning Silicone K.K.) containing 54 vol % of aluminum oxide (A-42-2, manufactured by Showa Denko K.K.) was used as the insulating adhesive. With respect to this circuit substrate, the heat resistance, the withstand voltage, the operation stability of electronic devices and the productivity were measured in the same manner. As shown in Table 5, the results were good.

EXAMPLE 35

A metal-base multilayer circuit substrate was prepared in the same manner as in Example 33 except that a bisphenol A type epoxy resin (Epikote 828, manufactured by Yuka Shell Co., Ltd.) containing 54 vol % of aluminum oxide (A-42-2, manufactured by Showa Denko K.K.) was used as the insulating adhesive. With respect to this circuit substrate, the heat resistance, the withstand voltage, the operation stability of electronic devices and the productivity were measured. As shown in Table 5, the results were good.

EXAMPLE 36

Using a bisphenol A type epoxy resin (Epikote 828, manufactured by Yuka Shell Co., Ltd.) containing 54 vol % of aluminum oxide (A-42-2, manufactured by Showa Denko K.K.) as an insulating adhesive, an amine type curing agent was added thereto, and the mixture was coated on an aluminum plate of 510 mm×510 mm×1.5 mm in a thickness of 200 μm. Then, a copper foil having a thickness of 5 μm was laminated thereon by a lamination method, followed by heat curing. Then, this copper foil was subjected to etching treatment to form a shield pattern. Then, an amine type curing agent was added to the above insulating adhesive, and the mixture was coated on this copper foil in a thickness of 200 μm. Then, a copper foil having a thickness of 5 μm was laminated thereon by a lamination method, followed by heat curing. Then, at a predetermined position of the outer copper foil, a round hole having a diameter of 0.5 mm was formed by etching, and a laser beam was irradiated to the opened portion to remove a part of the second insulating adhesive layer. Then, copper plating was applied to form a through-hole. Then, the outer copper foil was subjected to etching treatment to form a desired circuit to obtain a metal-base multilayer circuit substrate.

With respect to this metal-base multilayer circuit substrate, the heat resistance, the withstand voltage, the operation stability of electronic devices and the productivity were measured. As shown in Table 5, the results were good.

EXAMPLE 37

Using a bisphenol A type epoxy resin (Epikote 828, manufactured by Yuka Shell Co., Ltd.) containing 54 vol % of aluminum oxide (A-42-2, manufactured by Showa Denko K.K.) as an insulating adhesive, an amine type curing agent was added thereto, and the mixture was coated on an aluminum plate of 510 mm×510 mm×1.5 mm in a thickness of 200 μm. Then, a copper foil having a thickness of 150 μm was laminated thereon by a lamination method, followed by heat curing. Then, this copper foil was subjected to etching treatment to form a shield pattern. Then, an amine type curing agent was added to the above insulating adhesive, and the mixture was coated on the copper foil in a thickness of 200 μm. Then, a copper foil having a thickness of 150 μm was laminated thereon by a lamination method, followed by heat curing. Then, at a predetermined position of the outer copper foil, a round hole having a diameter of 0.5 mm was formed by etching, and a laser beam was irradiated to the opened portion to remove a part of the second insulating adhesive layer. Then, copper plating was applied to form a through-hole. Further, the outer copper foil was subjected to etching treatment to form a desired circuit to obtain a metal-base multilayer circuit substrate.

With respect to this metal-base multilayer circuit substrate, the heat resistance, the withstand voltage, the operation stability of electronic devices and the productivity were measured. As shown in Table 5, the results were good.

EXAMPLE 38

Using a bisphenol A type epoxy resin (Epikote 828, manufactured by Yuka Shell Co., Ltd.) containing 56 vol % of aluminum oxide (A-42-2, manufactured by Showa Denko K.K.) as an insulating adhesive, an amine type curing agent was added thereto, and the mixture was coated on an aluminum plate of 510 mm×510 mm×1.5 mm in a thickness of 200 μm. Then, a copper foil having a thickness of 35 μm was laminated thereon by a lamination method, followed by heat curing. Then, this copper foil was subjected to etching treatment to form a shield pattern. Then, using the above bisphenol A type epoxy resin (Epikote 828, manufactured by Yuka Shell Co., Ltd.) containing 54 vol % of aluminum oxide as an insulating adhesive, an amine type curing agent was added thereto, and the mixture was coated on the copper foil in a thickness of 250 μm. Then, a copper foil having a thickness of 35 μm was laminated thereon by a lamination method, followed by heat curing. Then, at a predetermined position of the outerlayer copper foil, a round hole having a diameter of 0.5 mm was formed by etching, and a laser beam was irradiated to the opened portion to remove a part of the second insulating adhesive layer. Then, copper plating was applied to form a through-hole. Further, the outerlayer copper foil was subjected to etching treatment to form a desired circuit to obtain a metal-base multilayer circuit substrate.

With respect to this metal-base multilayer circuit substrate, the heat resistance, the withstand voltage, the operation stability of electronic devices and the productivity were measured. As shown in Table 5, the results were good.

EXAMPLE 39

Using a bisphenol A type epoxy resin (Epikote 828, manufactured by Yuka Shell Co., Ltd.) containing 56 vol % of aluminum oxide (A-42-2, manufactured by Showa Denko K.K.) as an insulating adhesive, an amine type curing agent was added thereto, and the mixture was coated on an aluminum plate of 510 mm×510 mm×1.5 mm in a thickness of 20 $\mu$m. Then, a copper foil having a thickness of 35 $\mu$m was laminated thereon by a lamination method, followed by heat curing. Then, this copper foil was subjected to etching treatment to form a shield pattern. Then, using the above bisphenol A type epoxy resin (Epikote 828, manufactured by Yuka Shell Co., Ltd.) containing 54 vol % of aluminum oxide as an insulating adhesive, an amine type curing agent was added thereto, and the mixture was coated on the copper foil in a thickness of 250 $\mu$m. Further, a copper foil having a thickness of 35 $\mu$m was laminated thereon by a lamination method, followed by heat curing. Then, at a predetermined position of the outerlayer copper foil, a round hole having a diameter of 0.5 mm was formed by etching, and a laser beam was irradiated to the opened portion to remove a part of the second insulating adhesive layer. Then, copper plating was applied to form a through-hole. Further, the outerlayer copper foil was subjected to etching treatment to form a desired circuit to obtain a metal-base multilayer circuit substrate.

With respect to this metal-base multilayer circuit substrate, the heat resistance, the withstand voltage, the operation stability of electronic devices and the productivity were measured. As shown in Table 5, the results were good.

EXAMPLE 40

Using a bisphenol A type epoxy resin (Epikote 828, manufactured by Yuka Shell Co., Ltd.) containing 56 vol % of aluminum oxide (A-42-2, manufactured by Showa Denko K.K.) as an insulating adhesive, an amine type curing agent was added thereto, and the mixture was coated on an aluminum plate of 510 mm×510 mm×1.5 mm in a thickness of 200 $\mu$m. Then, a copper foil having a thickness of 35 $\mu$m was laminated thereon by a lamination method, followed by heat curing. Then, this copper foil was subjected to etching treatment to form a shield pattern. Then, an amine curing agent was added to the above insulating adhesive, and the mixture was coated on the copper foil in a thickness of 200 $\mu$m. Further, a copper foil having a thickness of 35 $\mu$m was laminated thereon by a lamination method, followed by heat curing. Then, at a predetermined position of the outerlayer copper foil, a round hole having a diameter of 0.5 mm was formed, and a laser beam was irradiated to the opened portion to remove a part of the second insulating adhesive layer. Then, copper plating was applied to form a through-hole. Further, the outerlayer copper foil was subjected to etching treatment to form a desired circuit to obtain a metal-base multilayer circuit substrate.

With respect to this metal-base multilayer circuit substrate, the heat resistance, the withstand voltage, the operation stability of electronic devices and the productivity were measured. As shown in Table 5, the results were good.

EXAMPLE 41

Using a bisphenol A type epoxy resin (Epikote 828, manufactured by Yuka Shell Co., Ltd.) containing 56 vol % of aluminum oxide (A-42-2, manufactured by Showa Denko K.K.) as an insulating adhesive, an amine type curing agent was added thereto, and the mixture was coated on an aluminum plate of 510 mm×510 mm×1.5 mm in a thickness of 200 $\mu$m. Then, a copper foil having a thickness of 35 $\mu$m was laminated thereon by a lamination method, followed by heat curing. Then, the copper foil was subjected to etching treatment to form a shield pattern. Then, an amine type curing agent was added to the above insulating adhesive, and the mixture was coated on the copper foil in a thickness of 40 $\mu$m. Then, a copper foil having a thickness of 35 $\mu$m was laminated thereon by a lamination method, followed by heat curing. Then, at a predetermined position of the outerlayer copper foil, a round hole having a diameter of 0.5 mm was formed by etching, and a laser beam was irradiated to the opened portion to remove a part of the second insulating adhesive layer. Then, copper plating was applied to form a through-hole. Further, the outerlayer copper foil was subjected to etching treatment to form a desired circuit to obtain a metal-base multilayer circuit substrate.

With respect to this metal-base multilayer circuit substrate, the heat resistance, the withstand voltage, the operation stability of electronic devices and the productivity were measured. As shown in Table 5, the results were good.

EXAMPLE 42

Using a bisphenol F type epoxy resin (Epikote 807, manufactured by Yuka Shell Co., Ltd.) containing 80 vol % of aluminum oxide (A-42-2, manufactured by Showa Denko K.K.) as an insulating adhesive, an amine type curing agent was added thereto, and the mixture was coated on an aluminum plate of 510 mm×510 mm×1.5 mm in a thickness of 200 $\mu$m. Then, a copper foil having a thickness of 35 $\mu$m was laminated thereon by a lamination method. Then, the copper foil was subjected to etching treatment to form a shield pattern. Then, an amine type curing agent was added to the above insulating adhesive, and the mixture was coated on the copper foil in a thickness of 200 $\mu$m. Then, a copper foil having a thickness of 35 $\mu$m was laminated thereon by a lamination method, followed by heat curing. Then, on a predetermined position of the outerlayer copper foil, a round hole having a diameter of 0.5 mm was formed by a drill and drilled to the depth of the second insulating adhesive layer. Then, copper plating was applied to form a through-hole. Further, the outerlayer copper foil was subjected to etching treatment to form a desired circuit to obtain a metal-base multilayer circuit substrate.

With respect to this metal-base multilayer circuit substrate, the heat resistance, the withstand voltage, the operation stability of electronic devices and the productivity were measured. As shown in Table 5, the results were good.

EXAMPLE 43

Using a bisphenol F type epoxy resin (Epikote 807, manufactured by Yuka Shell Co., Ltd.) containing 48 vol % of silicon nitride (SN-9, manufactured by Denki Kagaku Kogyo K.K.) as an insulating adhesive, an amine type curing agent was added thereto, and the mixture was coated on an aluminum plate of 510 mm×510 mm×1.5 mm in a thickness of 200 $\mu$m. Then, a copper foil having a thickness of 35 $\mu$m was laminated thereon by a lamination method. Then, the copper foil was subjected to etching treatment to form a shield pattern. Then, using a bisphenol F type epoxy resin containing 56 vol % of aluminum oxide (A-42-2, manufactured by Showa Denko K.K.) as an insulating adhesive, an amine type curing agent was added thereto, and the mixture was coated on the copper foil in a thickness of 200 μm. Then, a copper foil having a thickness of 35 μm was laminated thereon by a lamination method, followed by heat curing. Then, at a predetermined position of the outerlayer copper foil, a round hole having a diameter of 0.5 mm was formed by a drill and drilled to the depth of the second insulating adhesive layer. Then, copper plating was applied to form a through-hole. Further, the outerlayer copper foil was subjected to etching treatment to form a desired circuit to obtain a metal-base multilayer circuit substrate.

With respect to this metal-base multilayer circuit substrate, the heat resistance, the withstand voltage, the operation stability of electronic devices and the productivity were measured. As shown in Table 5, the results were good.

EXAMPLE 44

Using a bisphenol F type epoxy resin (Epikote 807, manufactured by Yuka Shell Co., Ltd.) containing 56 vol % of aluminum oxide (A-42-2, manufactured by Showa Denko K.K.) as an insulating adhesive, an amine type curing agent was added thereto, and the mixture was coated on an aluminum plate of 510 mm×510 mm×1.5 mm in a thickness of 200 μm. Then, a copper foil having a thickness of 35 μm was laminated thereon by a lamination method. Then, the copper foil was subjected to etching treatment to form a shield pattern. Then, using a bisphenol F type epoxy resin containing 48 vol % of silicon nitride (SN-9, manufactured by Denki Kagaku Kogyo K.K.) as an insulating adhesive, an amine type curing agent was added thereto, and the mixture was coated on the copper foil in a thickness of 200 μm. Then, a copper foil having a thickness of 35 μm was laminated thereon by a lamination method, followed by heat curing. Then, at a predetermined position of the outerlayer copper foil, a round hole having a diameter of 0.5 mm was formed by a drill and drilled to the depth of the second insulating adhesive layer. Then, copper plating was applied to form a through-hole. Further, the outerlayer copper foil was subjected to etching treatment to form a desired circuit to obtain a metal-base multilayer circuit substrate.

With respect to this metal-base multilayer circuit substrate, the heat resistance, the withstand voltage, the operation stability of electronic devices and the productivity were measured. As shown in Table 5, the results were good.

COMPARATIVE EXAMPLE 6

A through-hole having a diameter of 0.5 mm was formed by a drill at a predetermined position in a glass epoxy resin circuit substrate which had a thickness of the base material of 60 μm and which had desired circuits having a thickness of 35 μm on both sides of the base material. Then, copper plating was applied to form a through-hole. Further, copper foils on both sides were subjected to etching treatment to form desired circuits. Then, a glass epoxy prepreg was coated on an aluminum plate of 510 mm×510 mm×1.5 mm in a thickness of 100 μm. Then, the above glass epoxy resin circuit substrate was disposed thereon, followed by heat curing to obtain a metal-base multilayer circuit substrate.

With respect to this metal-base multilayer circuit substrate, the heat resistance, the withstand voltage, the operation stability of electronic devices and the productivity were measured in the same manner as in Example 33. As a result, the heat resistance was 3.8° C./W, and the operation stability of the power electronic devices was 20 W and thus was poor.

COMPARATIVE EXAMPLE 7

A through-hole having a diameter of 0.5 mm was formed by a drill at a predetermined position in a glass epoxy resin circuit substrate (R-1766, manufactured by Matsushita Electric Works, Ltd.) which was provided on both sides with desired circuits made of a copper foil having a thickness of 35 μm and the base material of which is made of a glass epoxy resin having a thickness of 60 μm. Then, using a bisphenol F type epoxy resin (Epikote 807, manufactured by Yuka Shell Co., Ltd.) containing 57 vol % of silicon nitride (SN-9, manufactured by Denki Kagaku Kogyo K.K.), an amine type curing agent was added thereto, and the mixture was coated on an aluminum plate of 510 mm×510 mm×1.5 mm in a thickness of 200 μm. Then, the above glass epoxy resin circuit substrate was laminated thereon by a lamination method, followed by heat curing to obtain a metal-base multilayer circuit substrate.

With respect to the above metal-base multilayer circuit substrate, the heat resistance, the withstand voltage, the operation stability of electronic devices and the productivity were measured. As a result, as shown in Table 5, the productivity was low and poor although the heat resistance, the withstand voltage and the operation stability of electronic devices were good.

TABLE 5

| | | | | Metal base circuit substrate | | | |
| --- | --- | --- | --- | --- | --- | --- | --- |
| | | | | First insulating adhesive layer | | | |
| | | Resin | Inorganic substrate | Amount (vol %) | Heat conductivity (cal/cm · sec · °C.) | Thickness (μm) | Thickness of conductor circuit (μm) |
| Example | 33 | A | BN | 53 | $35 \times 10^{-4}$ | 220 | 35 |
| | 34 | S | $Al_2O_3$ | 54 | $32 \times 10^{-4}$ | 200 | 35 |
| | 35 | B | $Al_2O_3$ | 54 | $32 \times 10^{-4}$ | 200 | 35 |
| | 36 | B | $Al_2O_3$ | 54 | $32 \times 10^{-4}$ | 200 | 5 |
| | 37 | B | $Al_2O_3$ | 54 | $32 \times 10^{-4}$ | 200 | 150 |
| | 38 | B | $Al_2O_3$ | 56 | $35 \times 10^{-4}$ | 200 | 35 |
| | 39 | B | $Al_2O_3$ | 56 | $35 \times 10^{-4}$ | 20 | 35 |
| | 40 | B | $Al_2O_3$ | 56 | $35 \times 10^{-4}$ | 200 | 35 |
| | 41 | B | $Al_2O_3$ | 56 | $35 \times 10^{-4}$ | 200 | 35 |
| | 42 | A | $Al_2O_3$ | 80 | $130 \times 10^{-4}$ | 200 | 35 |
| | 43 | A | $Si_3N_4$ | 48 | $21 \times 10^{-4}$ | 200 | 35 |
| | 44 | A | $Al_2O_3$ | 56 | $35 \times 10^{-4}$ | 200 | 35 |
| Comparative | 6 | | Glass epoxy resin | | $5.5 \times 10^{-4}$ | 100 | 35 |
| tive | 7 | A | $Si_3N_4$ | 57 | $30 \times 10^{-4}$ | 200 | 35 |

TABLE 5-continued

| Example | | Resin | Second insulating adhesive layer | | | | Thickness of conductor layer circuit (μm) | WV | HR | OS | PR |
|---|---|---|---|---|---|---|---|---|---|---|---|
| | | | Inorganic Substrate | Amount (vol %) | Heat conductivity (cal/cm · sec · °C.) | Thickness (μm) | | | | | |
| Example | 33 | A | BN | 53 | 35 × 10⁻⁴ | 200 | 35 | >10 | 1.8 | >50 | 8 |
| | 34 | S | Al₂O₃ | 54 | 32 × 10⁻⁴ | 200 | 35 | >10 | 1.9 | >50 | 8 |
| | 35 | B | Al₂O₃ | 54 | 32 × 10⁻⁴ | 200 | 35 | >10 | 1.9 | >50 | 8 |
| | 36 | B | Al₂O₃ | 54 | 32 × 10⁻⁴ | 200 | 5 | >10 | 1.9 | >50 | 8 |
| | 37 | B | Al₂O₃ | 54 | 32 × 10⁻⁴ | 200 | 150 | >10 | 1.9 | >50 | 8 |
| | 38 | B | Al₂O₃ | 54 | 32 × 10⁻⁴ | 250 | 35 | >10 | 2.1 | >50 | 8 |
| | 39 | B | Al₂O₃ | 54 | 32 × 10⁻⁴ | 250 | 35 | >10 | 1.6 | >50 | 8 |
| | 40 | B | Al₂O₃ | 56 | 35 × 10⁻⁴ | 200 | 35 | >10 | 1.8 | >50 | 8 |
| | 41 | B | Al₂O₃ | 56 | 35 × 10⁻⁴ | 40 | 35 | 4.0 | 1.5 | >50 | 8 |
| | 42 | A | Al₂O₃ | 80 | 130 × 10⁻⁴ | 200 | 35 | >10 | 0.9 | >50 | 8 |
| | 43 | A | Al₂O₃ | 56 | 35 × 10⁻⁴ | 200 | 35 | >10 | 1.1 | >50 | 8 |
| | 44 | A | Si₃N₄ | 48 | 21 × 10⁻⁴ | 200 | 35 | >10 | 1.1 | >50 | 8 |
| Comparative Example | 6 | | Glass epoxy resin | | 5.5 × 10⁻⁴ | 60 | 35 | 4.8 | 3.8 | 20 | 8 |
| | 7 | | Glass epoxy resin | | 5.5 × 10⁻⁴ | 60 | 35 | 4.8 | 1.8 | >50 | 40 |

Note:
A: Bisphenol A type epoxy resin,
B: Bisphenol F type epoxy resin,
C: Silicone resin,
WV: Withstand voltage (kV),
HR: Heat resistance (° C./W),
OS: Operation. stability of electronic devices (W),
PR: Productivity (hr)

EXAMPLE 45

Using a bisphenol F type epoxy resin (Epikote 807, manufactured by Yuka Shell Co., Ltd.) containing 53 vol % of boron nitride (GP, manufactured by Denki Kagaku Kogyo K.K.) as an insulating adhesive, an amine type curing agent was added thereto, and the mixture was coated on an aluminum plate of 510 mm×510 mm×1.5 mm in a thickness of 200 μm. Then, a copper foil having a thickness of 35 μm was laminated thereon by a lamination method. Then, an amine type curing agent was added to the above insulating adhesive, and the mixture was coated on this copper foil in a thickness of 200 μm. Further, a copper foil having a thickness of 35 μm was laminated thereon by a lamination method, followed by heat curing. Then, at a predetermined position of the outerlayer copper foil, a round hole having a diameter of 0.5 mm was formed by a drill and drilled to the depth of the second insulating adhesive layer. Then, copper plating was applied to form a through-hole. On this surface, a desired circuit was formed by etching to obtain a metal-base multilayer circuit substrate. Using this substrate base sheet, a DC/DC converter having a substrate size of 100 mm×150 mm, an output power of 150 W and an operational frequency of 300 kHz, was prepared. An electronically controlled device was disposed on a conductor layer 6 for a circuit as shown in FIG. 11, and a high frequency transformer (capacity: 150 VA, manufactured by TDK Corp.) as a heat emissive device was fixed on the insulating adhesive layer by a silicone adhesive.

This module was operated at a room temperature of 25° C. for 5 hours, whereby the temperature on the rear side of the substrate was measured and found to be 92° C., and the module was functionally stably operated during this period.

EXAMPLE 46

Using a bisphenol A type epoxy resin (Epikote 828, manufactured by Yuka Shell Co., Ltd.) containing 54 vol % of aluminum oxide (A-42-2, manufactured by Showa Denko K.K.) as an insulating adhesive, an amine type curing agent was added thereto, and the mixture was coated on an aluminum plate of 510 mm×510 mm×1.5 mm in a thickness of 200 μm. Then, a copper foil having a thickness of 5 μm was laminated thereon by a lamination method, followed by heat curing. Then, an amine curing agent was added to the above insulating adhesive, and the mixture was coated on this copper foil in a thickness of 200 μm. Then, a copper foil having a thickness of 5 μm was laminated thereon by a lamination method, followed by heat curing. Then, at a predetermined position of the outerlayer copper foil, a round hole having a diameter of 0.5 mm was formed by etching, and a laser beam was irradiated to the opened portion to remove a part of the second insulating adhesive layer. Then, copper plating was applied to form a through-hole. Then, the outerlayer copper foil was subjected to etching treatment to form a desired circuit to obtain a metal-base multilayer circuit substrate.

By using this substrate base sheet, a DC/DC converter having a substrate size of 100 mm×150 mm, an output power of 150 W and an operational frequency of 300 kHz, was prepared. An electronically controlled device was disposed on a conductor layer 6 for a circuit as shown in FIG. 11, and a high frequency transformer (capacity: 150 VA, manufactured by TDK Corp.) as a heat emissive device was fixed on the insulating adhesive layer by a silicone adhesive.

This module was operated at a room temperature of 25° C. for 5 hours, whereby the temperature on the rear side of the substrate was measured and found to be 92° C., and the module was functionally stably operated during this period.

EXAMPLE 47

Using a bisphenol F type epoxy resin (Epikote 807, manufactured by Yuka Shell Co., Ltd.) containing 53 vol % of boron nitride (GP, manufactured by Denki Kagaku Kogyo K.K.) as an insulating adhesive, an amine type curing agent was added thereto, and the mixture was coated on an aluminum plate of 510 mm×510 mm×1.5 mm in a thickness of 200 µm. Then, a copper foil having a thickness of 35 µm was laminated thereon by a lamination method. Then, an amine curing agent was added to the above insulating adhesive, and the mixture was coated on this copper foil in a thickness of 200 µm. Further, a copper foil having a thickness of 35 µm was laminated thereon by a lamination method, followed by heat curing. Then, at a predetermined position of the outerlayer copper foil, a round hole having a diameter of 0.5 mm was formed by a drill and drilled to the depth of the second insulating adhesive layer. Then, copper plating was applied to form a through-hole. On this surface, a desired circuit was formed by etching to obtain a metal-base multilayer circuit substrate.

Using this substrate base sheet, a DC/DC converter having a substrate size of 100 mm×150 mm, an output power of 250 W and an operational frequency of 300 kHz, was prepared. An electronically controlled device was disposed on a conductor layer 6 for a circuit as shown in FIG. 11, and a high frequency transformer (capacity: 250 VA, manufactured by TDK Corp.) as a heat emissive device was fixed on the insulating adhesive layer by a silicone adhesive.

This module was operated at a room temperature of 25° C. for 5 hours, whereby the temperature on the rear side of the substrate was measured and found to be 110° C., and the module was operated functionally slightly unstably during this period.

EXAMPLE 48

Using a bisphenol A type epoxy resin (Epikote 828, manufactured by Yuka Shell Co., Ltd.) containing 54 vol % of aluminum oxide (A-42-2, manufactured by Showa Denko K.K.) as an insulating adhesive, an amine type curing agent was added thereto, and the mixture was coated on an aluminum plate of 510 mm×510 mm×1.5 mm in a thickness of 200 µm. Then, a copper foil having a thickness of 5 µm was laminated thereon by a lamination method, followed by heat curing. Then, an amine curing agent was added to the above insulating adhesive, and the mixture was coated on this copper foil in a thickness of 200 µm. Then, a copper foil having a thickness of 5 µm was laminated thereon by a lamination method, followed by heat curing. Then, at a predetermined position of the outerlayer copper foil, a round hole having a diameter of 0.5 mm was formed by etching, and a laser beam was irradiated to the opened portion to remove a part of the second insulating adhesive layer. Then, copper plating was applied to form a through-hole. Then, the outerlayer copper foil was subjected to etching to form a desired circuit to obtain a metal-base multilayer circuit substrate.

Using this substrate base sheet, a DC/DC converter having a substrate size of 100 mm×150 mm, an output power of 250 W and an operational frequency of 300 kHz, was prepared. An electronically controlled device was disposed on the conductor layer 6 for a circuit as shown in FIG. 11, and a high frequency transformer (capacity: 250 VA, manufactured by TDK Corp.) as a heat emissive device was fixed on the insulating adhesive layer by a silicone adhesive.

This module was operated at a room temperature of 25° C. for 5 hours, whereby the temperature on the rear side of the substrate was measured and found to be 110° C., and the module was operated functionally slightly unstably during this period.

EXAMPLE 49

Using a bisphenol F type epoxy resin (Epikote 807, manufactured by Yuka Shell Co., Ltd.) containing 53 vol % of boron nitride (GP, manufactured by Denki Kagaku Kogyo K.K.) as an insulating adhesive, an amine type curing agent was added thereto, and the mixture was coated on an aluminum plate of 510 mm×510 mm×1.5 mm in a thickness of 200 µm. Then, a copper foil having a thickness of 35 µm was laminated thereon by a lamination method. Then, this copper foil was subjected to etching treatment to form a shield pattern. Then, an amine type curing agent was added to the above insulating adhesive, and the mixture was coated on the copper foil in a thickness of 200 µm. Further, a copper foil having a thickness of 35 µm was laminated thereon by a lamination method, followed by heat curing. Then, at a predetermined position of the outerlayer copper foil, a round hole having a diameter of 0.5 mm was formed by a drill and drilled to the depth of the second insulating adhesive layer. Then, copper plating was applied to form a through-hole. On this surface, a desired circuit was formed by etching to obtain a metal-base multilayer circuit substrate.

Using this substrate base sheet, a DC/DC converter having a substrate size of 100 mm×150 mm, an output power of 150 W and an operational frequency of 300 kHz, was prepared. An electronically controlled device was disposed on the conductor layer 6 for a circuit as shown in FIG. 11, and a high frequency transformer (capacity: 150 VA, manufactured by TDK Corp.) as a heat emissive device was fixed on the insulating adhesive layer by a silicone adhesive.

This module was operated at a room temperature of 25° C. for 5 hours, whereby the temperature on the rear side of the substrate was measured and found to be 92° C., and the module was functionally very stably operated during this period.

EXAMPLE 50

Using a bisphenol A type epoxy resin (Epikote 828, manufactured by Yuka Shell Co., Ltd.) containing 54 vol % of aluminum oxide (A-42-2, manufactured by Showa Denko K.K.) as an insulating adhesive, an amine type curing agent was added thereto, and the mixture was coated on an aluminum plate of 510 mm×510 mm×1.5 mm in a thickness of 200 µm. Then, a copper foil having a thickness of 5 µm was laminated thereon by a lamination method, followed by heat curing. Then, this copper foil was subjected to etching treatment to form a shield pattern. Then, an amine type curing agent was added to the above insulating adhesive, and the mixture was coated on the copper foil in a thickness of 200 µm. Then, a copper foil having a thickness of 5 µm was laminated thereon by a lamination method, followed by heat curing. Then, at a predetermined position of the outerlayer copper foil, a round hole having a diameter of 0.5 mm was formed by etching, and a laser beam was irradiated to the opened portion to remove a part of the second insulating adhesive layer. Then, copper plating was applied to form a through-hole. Then, the outerlayer copper foil was subjected to etching to form a desired circuit to obtain a metal-base multilayer circuit substrate.

Using this substrate base sheet, a DC/DC converter having a substrate size of 100 mm×150 mm, an output power of 150 W and an operational frequency of 300 kHz, was prepared. An electronically controlled device was disposed on the conductor layer 6 for a circuit as shown in FIG. 11, and a high frequency transformer (capacity: 150 VA, manufactured by TDK Corp.) as a heat emissive device was fixed on the insulating adhesive layer by a silicone adhesive.

EXAMPLE 51

Using a bisphenol F type epoxy resin (Epikote 807, manufactured by Yuka Shell Co., Ltd.) containing 53 vol % of boron nitride (GP, manufactured by Denki Kagaku Kogyo K.K.) as an insulating adhesive, an amine type curing agent was added thereto, and the mixture was coated on an aluminum plate of 510 mm×510 mm×1.5 mm in a thickness of 200 $\mu$m. Then, a copper foil having a thickness of 35 $\mu$m was laminated thereon by a lamination method. Then, this copper foil was subjected to etching treatment to form a shield pattern. Then, an amine type curing agent was added to the above insulating adhesive, and the mixture was coated on the copper foil in a thickness of 200 $\mu$m. Further, a copper foil having a thickness of 35 $\mu$m was laminated thereon by a lamination method, followed by heat curing. Then, at a predetermined position of the outerlayer copper foil, a round hole having a diameter of 0.5 mm was formed by a drill and drilled to the depth of the second insulating adhesive layer. Then, copper plating was applied to form a through-hole. On this surface, a desired circuit was formed by etching to obtain a metal-base multilayer circuit substrate.

Using this substrate base sheet, a DC/DC converter having a substrate size of 100 mm×150 mm, an output power of 250 W and an operational frequency of 300 kHz, was prepared. An electronically controlled device was disposed on the conductor layer 6 for a circuit as shown in FIG. 11, and a high frequency transformer (capacity: 250 VA, manufactured by TDK Corp.) as a heat emissive device was fixed on the insulating adhesive layer by a silicone adhesive.

This module was operated at a room temperature of 25° C. for 5 hours, whereby the temperature on the rear side of the substrate was measured and found to be 110° C., and the module was functionally very stably operated during this period.

EXAMPLE 52

Using a bisphenol A type epoxy resin (Epikote 828, manufactured by Yuka Shell Co., Ltd.) containing 54 vol % of aluminum oxide (A-42-2, manufactured by Showa Denko K.K.) as an insulating adhesive, an amine type curing agent was added thereto, and the mixture was coated on an aluminum plate of 510 mm×510 mm×1.5 mm in a thickness of 200 $\mu$m. Then, a copper foil having a thickness of 5 $\mu$m was laminated thereon by a lamination method, followed by heat curing. Then, this copper foil was subjected to etching treatment to form a shield pattern. Then, an amine curing agent was added to the above insulating adhesive, and the mixture was coated on the copper foil in a thickness of 200 $\mu$m. Then, a copper foil having a thickness of 5 $\mu$m was laminated thereon by a lamination method, followed by heat curing. Then, at a predetermined position of the outerlayer copper foil, a round hole having a diameter of 0.5 mm was formed by etching, and a laser beam was irradiated to the opened portion to remove a part of the second insulating adhesive layer. Then, copper plating was applied to form a through-hole. Then, the outerlayer copper foil was subjected to etching treatment to form a desired circuit to obtain a metal-base multilayer circuit substrate.

Using this substrate base sheet, a DC/DC converter having a substrate size of 100 mm×150 mm, an output power of 250 W and an operational frequency of 300 kHz, was prepared. An electronically controlled device was disposed on the conductor layer 6 for a circuit as shown in FIG. 11, and a high frequency transformer (capacity: 250 VA, manufactured by TDK Corp.) as a heat emissive device was fixed on the insulating adhesive layer by a silicone adhesive.

This module was operated at a room temperature of 25° C. for 5 hours, whereby the temperature on the rear side of the substrate was measured and found to be 110° C., and the module was functionally very stably operated during this period.

The results of the foregoing Examples 45 to 52 are listed in Table 6. To make the comparison easy, the results of Comparative Examples 4 and 5 are again given in Table 6.

TABLE 6

| | Type of circuit substrate | Output of heat emissive electronic devices (W) | Shield pattern | Temp. on the rear side of the metal plate (° C.) | Operation stability |
|---|---|---|---|---|---|
| Example | | | | | |
| 45 | Double-sided resin substrate | 150 | Nil | 92 | Normal |
| 46 | Double-sided resin substrate | 150 | Nil | 92 | Normal |
| 47 | Double-sided resin substrate | 250 | Nil | 110 | Normal |
| 48 | Double-sided resin substrate | 250 | Nil | 110 | Normal |
| 49 | Double-sided resin substrate | 150 | Present | 92 | Very stable |
| 50 | Double-sided resin substrate | 150 | Present | 92 | Very stable |
| 51 | Double-sided resin substrate | 250 | Present | 110 | Very stable |
| 52 | Double-sided resin substrate | 250 | Present | 110 | Very stable |
| Comparative Example | | | | | |
| 4 | Glass epoxy circuit substrate | 150 | Nil | 193 | Unstable |
| 5 | Glass epoxy circuit substrate | 150 | Nil | 163 | Unstable |

The metal-base multilayer circuit substrate of the present invention is excellent not only in the heat dissipation properties but also in the noise shielding properties and the voltage withstanding properties. Accordingly, it provides a merit in that a highly reliable semiconductor module can easily be obtained by using this metal-base multilayer circuit substrate. Such a semiconductor module can be employed with high reliability in various fields including the power source field for a high power application to which the conventional module could not be applied. In addition, it is suitable for downsizing, high density packaging and high performance improvement of semiconductor module in the conventional field. Thus, the present invention is very useful.

Further, according to the process of producing a metal-base multilayer circuit substrate according to the present invention, the above metal-base multilayer circuit substrate can be obtained constantly with a high quality and with high productivity. Thus, the process of the present invention is very useful.

What is claimed is:

1. A metal-base multilayer circuit substrate having a first circuit conductor layer on one side of a circuit substrate, and a second circuit conductor layer on the other side of said circuit substrate, which metal-base multilayer circuit substrate comprises a metal plate and said circuit substrate bonded thereon through the side containing the first circuit conductor layer by a first insulating adhesive layer containing at least one member selected from the group consisting of metal oxides and metal nitrides, wherein said metal plate is an outermost layer of said multilayer circuit substrate, and said metal plate has a thickness of 0.5 to 3 mm, and wherein the first insulating adhesive layer is selected such that the heat resistance between said metal plate and the second circuit conductor layer is at most 2.5°C./W.

2. The metal-base multilayer circuit substrate according to claim 1, wherein the first insulating adhesive layer has a heat conductivity of from $35 \times 10^{-4}$ cal/cm·sec·°C. to $150 \times 10^{-4}$ cal/cm·sec·°C. and a thickness of from 20 $\mu$m to 200 $\mu$m.

3. The metal-base multilayer circuit substrate according to claim 1, wherein the metal oxide is aluminum oxide or silicon oxide, and the metal nitride is boron nitride.

4. The metal-base multilayer circuit substrate according to claim 1, wherein the first circuit conductor layer on the circuit substrate has a surface roughness Rz of from 0.1 $\mu$m to 10 $\mu$m on its surface facing the first insulating adhesive layer.

5. The metal-base multilayer circuit substrate according to claim 4, wherein the first circuit conductor layer on the circuit substrate is provided with a plated copper layer on its surface facing the first insulating adhesive layer.

6. The metal-base multilayer circuit substrate according to claim 5, wherein the plated copper layer contains at least either nickel or cobalt.

7. A semiconductor module, comprising:

a metal-base multilayer circuit substrate, and a semiconductor device, mounted on said metal-base multilayer circuit substrate, and wire-bonded by an aluminum wire or a gold wire, wherein said metal base multilayer circuit substrate comprises a metal plate and a circuit substrate bonded thereon by a first insulating adhesive layer containing at least one member selected from the group consisting of metal oxides and metal nitrides, said circuit substrate comprises at least two circuit conductor layers bonded by a second insulating adhesive layer containing at least one member selected from the group consisting of metal oxides and metal nitrides, the second insulating adhesive layer has a heat conductivity of from $35 \times 10^{-4}$ cal/cm·sec·°C. to $150 \times 10^{-4}$ cal/cm·sec·°C. and a thickness of from 40 $\mu$m to 20 $\mu$m, said metal plate is an outermost layer of said multilayer substrate, and said circuit conductor layers have a thickness of 5 to 150 $\mu$m.

8. The semiconductor module of claim 7, wherein said metal plate has a thickness of 0.5 to 3 mm.

9. The semiconductor module according to claim 7, wherein a first circuit conductor layer facing the first insulating adhesive layer of the circuit substrate is used as a shield pattern.

10. A process for producing a metal-base multilayer circuit substrate as defined in claim 1, which comprises:

(1) a step of bonding a second circuit conductor layer by means of a second insulating adhesive layer on at least a first circuit conductor layer of a metal-base circuit substrate comprising a metal plate and the first circuit conductor layer formed on a metal plate by means of a first insulating adhesive layer, (2) a step of forming a through-hole for electrically connecting the second circuit conductor layer and the first circuit conductor layer, and (3) a step of forming a circuit in the second circuit conductor layer.

11. The process for producing a metal-base multilayer circuit substrate according to claim 10, wherein the first insulating adhesive layer is heat-cured prior to step (2).

12. The process for producing a metal-base multilayer circuit substrate according to claim 10, wherein in step (2) for forming the through-hole, a predetermined portion of the second circuit conductor layer is removed by etching to form a hole, and a laser beam is irradiated through the hole to remove the second insulating adhesive layer to form a through-hole.

13. The process for producing a metal-base multilayer circuit substrate according to claim 10, wherein the first circuit conductor layer has a thickness of from 5 $\mu$m to 150 $\mu$m.

* * * * *